(12) United States Patent
Wells et al.

(10) Patent No.: US 10,615,604 B2
(45) Date of Patent: Apr. 7, 2020

(54) DECOUPLING SYNCHROPHASOR BASED CONTROL SYSTEM FOR DISTRIBUTED ENERGY RESOURCES

(71) Applicant: PXiSE Energy Solutions, LLC, San Diego, CA (US)

(72) Inventors: Charles H. Wells, San Diego, CA (US); Raymond A. de Callafon, San Diego, CA (US); Patrick T. Lee, San Diego, CA (US)

(73) Assignee: PXiSE Energy Solutions, LLC, San Diego, CA (US)

( * ) Notice: Subject to any disclaimer, the term of this patent is extended or adjusted under 35 U.S.C. 154(b) by 0 days.

(21) Appl. No.: 15/607,076

(22) Filed: May 26, 2017

(65) Prior Publication Data

US 2017/0346291 A1    Nov. 30, 2017

Related U.S. Application Data

(63) Continuation-in-part of application No. 15/168,034, filed on May 28, 2016, now Pat. No. 10,027,119.

(51) Int. Cl.
*H02J 3/38* (2006.01)
*H02J 3/46* (2006.01)
(Continued)

(52) U.S. Cl.
CPC .......... *H02J 3/381* (2013.01); *G01R 19/2513* (2013.01); *G06F 1/26* (2013.01);
(Continued)

(58) Field of Classification Search
None
See application file for complete search history.

(56) References Cited

U.S. PATENT DOCUMENTS

| | | | |
|---|---|---|---|
| 4,251,735 A * | 2/1981 | Coleman | H02J 3/32 307/46 |
| 6,819,087 B2 | 11/2004 | Delmerico et al. | |

(Continued)

FOREIGN PATENT DOCUMENTS

| | | |
|---|---|---|
| CN | 102185326 A | 9/2011 |
| CN | 102707628 A | 10/2012 |

(Continued)

OTHER PUBLICATIONS

Patent Cooperation Treaty, International Search Report for PCT/US2017/034765, dated Oct. 9, 2017.

(Continued)

*Primary Examiner* — Lina M Cordero
(74) *Attorney, Agent, or Firm* — Jones Day

(57) ABSTRACT

Attributes of a power system having one or more distributed energy resources are characterized by continuously receiving data comprising a power data stream having at least two components and derived from at least one distributed energy resource. A control data stream comprising at least two components is generated. An error data stream is determined based on a difference between respective components of the power data stream to components of a reference data stream comprising at least two components. The error data stream and the reference data stream are processed to generate the control data stream. The control data stream is continuously output to enable control and/or monitoring of the power flow of at least one distributed energy resource.

27 Claims, 10 Drawing Sheets

(51) Int. Cl.
  *G06F 1/26* (2006.01)
  *H02J 13/00* (2006.01)
  *H04L 12/26* (2006.01)
  *G01R 19/25* (2006.01)
  *G01R 21/127* (2006.01)

(52) U.S. Cl.
  CPC ............ *H02J 3/382* (2013.01); *H02J 3/46*
  (2013.01); *H02J 13/0013* (2013.01); *H04L*
  *43/08* (2013.01); *G01R 21/1271* (2013.01);
  *Y02B 90/2607* (2013.01); *Y02E 40/72*
  (2013.01); *Y04S 10/123* (2013.01); *Y04S 40/12*
  (2013.01); *Y04S 40/168* (2013.01)

(56) References Cited

U.S. PATENT DOCUMENTS

| | | |
|---|---|---|
| 6,985,800 B2 | 1/2006 | Rehtanz et al. |
| 7,096,175 B2 | 8/2006 | Rehtanz et al. |
| 7,274,975 B2 | 9/2007 | Miller |
| 7,490,013 B2 | 2/2009 | Wells |
| 7,498,821 B2 | 3/2009 | Wells |
| 7,710,729 B2 | 5/2010 | Li et al. |
| 7,755,371 B2 | 7/2010 | Wells |
| 7,961,112 B2 | 6/2011 | Wells |
| 7,987,059 B2 * | 7/2011 | Gong ............... H02J 3/24 307/102 |
| 8,022,575 B2 | 9/2011 | Korba et al. |
| 8,457,912 B1 | 6/2013 | Wells |
| 8,498,752 B2 | 7/2013 | Wells |
| 8,532,230 B2 | 9/2013 | Taft |
| 8,659,186 B2 | 2/2014 | Teichmann et al. |
| 8,738,191 B2 | 5/2014 | Kivaliotis et al. |
| 8,892,375 B2 | 11/2014 | Taft |
| 8,907,615 B2 | 12/2014 | Mills-Price et al. |
| 8,942,856 B2 | 1/2015 | Ren et al. |
| 9,037,425 B2 | 5/2015 | Yang et al. |
| 9,043,037 B2 | 5/2015 | Bhageria et al. |
| 9,166,500 B2 | 10/2015 | Wu et al. |
| 9,230,429 B2 | 1/2016 | McKinley et al. |
| 9,411,389 B2 | 8/2016 | Shi et al. |
| 9,444,257 B2 | 9/2016 | Wells |
| 9,496,715 B2 | 11/2016 | Wilson |
| 9,507,367 B2 | 11/2016 | Venayagamoorthy et al. |
| 9,588,156 B2 | 3/2017 | Glavic et al. |
| 9,634,850 B2 | 4/2017 | Taft et al. |
| 2003/0035308 A1 * | 2/2003 | Lynch ............... H02J 3/18 363/34 |
| 2004/0051387 A1 * | 3/2004 | Lasseter ............. H02J 3/46 307/80 |
| 2007/0282547 A1 * | 12/2007 | Howell ............. G01R 22/10 702/60 |
| 2008/0071482 A1 | 3/2008 | Zweigle et al. |
| 2008/0077336 A1 * | 3/2008 | Fernandes ......... G01R 15/142 702/57 |
| 2009/0315566 A1 * | 12/2009 | Thiim ............. G01R 31/025 324/551 |
| 2009/0319090 A1 | 12/2009 | Dillon et al. |
| 2011/0276194 A1 | 11/2011 | Emalfarb et al. |
| 2013/0043690 A1 | 2/2013 | Wilson et al. |
| 2013/0073108 A1 | 3/2013 | Kolwalkar |
| 2013/0073109 A1 | 3/2013 | Cheng et al. |
| 2013/0218494 A1 | 8/2013 | Chiang et al. |
| 2013/0262012 A1 | 10/2013 | O'Sullivan et al. |
| 2013/0322139 A1 * | 12/2013 | Lee ............... H02M 7/68 363/84 |
| 2013/0338954 A1 * | 12/2013 | Seki ............. G01R 19/2513 702/75 |
| 2014/0070617 A1 | 3/2014 | Detmers et al. |
| 2014/0074306 A1 | 3/2014 | Lu et al. |
| 2014/0074311 A1 | 3/2014 | Kearns et al. |
| 2014/0100705 A1 | 4/2014 | Shi et al. |
| 2014/0142779 A1 * | 5/2014 | Stoettrup ............. H02J 3/28 700/297 |
| 2014/0159658 A1 | 6/2014 | Kiceniuk et al. |
| 2014/0188689 A1 * | 7/2014 | Kalsi ............... H02J 3/00 705/37 |
| 2014/0244065 A1 | 8/2014 | Biswas et al. |
| 2014/0268957 A1 * | 9/2014 | Khajehoddin ........ H02J 3/1842 363/95 |
| 2014/0277599 A1 | 9/2014 | Pande et al. |
| 2014/0306534 A1 | 10/2014 | Shi et al. |
| 2014/0307494 A1 | 10/2014 | Wu et al. |
| 2015/0005967 A1 | 1/2015 | Jóhannsson et al. |
| 2015/0005970 A1 * | 1/2015 | Zweigle ............. H02J 3/24 700/295 |
| 2015/0006141 A1 | 1/2015 | Enenkel et al. |
| 2015/0051852 A1 | 2/2015 | Pan et al. |
| 2015/0051856 A1 | 2/2015 | Chu et al. |
| 2015/0073735 A1 | 3/2015 | Abido et al. |
| 2015/0100282 A1 | 4/2015 | Shokooh et al. |
| 2015/0102674 A1 * | 4/2015 | Rudolph ............. H02J 3/381 307/52 |
| 2015/0326160 A1 | 11/2015 | Diez-Maroto et al. |
| 2016/0003879 A1 | 1/2016 | Wilson et al. |
| 2016/0091537 A1 | 3/2016 | Gaarder et al. |
| 2016/0118878 A1 | 4/2016 | Alteneiji |
| 2016/0147215 A1 * | 5/2016 | Baone ............. G01R 19/2513 700/291 |
| 2016/0179120 A1 | 6/2016 | Boardman et al. |
| 2016/0198245 A1 | 7/2016 | Rhoads et al. |
| 2016/0241035 A1 | 8/2016 | Shi et al. |
| 2016/0266559 A1 | 9/2016 | Shi et al. |
| 2016/0299187 A1 | 10/2016 | Liang et al. |
| 2016/0313197 A1 | 10/2016 | Acharya et al. |
| 2016/0320435 A1 | 11/2016 | Budhraja et al. |
| 2016/0329700 A1 | 11/2016 | O'Brien et al. |
| 2016/0329709 A1 | 11/2016 | Park et al. |
| 2016/0334447 A1 | 11/2016 | Parashar et al. |
| 2017/0012468 A1 | 1/2017 | Park |
| 2017/0017298 A1 | 1/2017 | Biswas et al. |
| 2017/0104366 A1 | 4/2017 | Münz |
| 2017/0109524 A1 | 4/2017 | Kolacinski et al. |
| 2017/0346286 A1 | 11/2017 | Wells et al. |
| 2017/0346291 A1 | 11/2017 | Wells et al. |

FOREIGN PATENT DOCUMENTS

| | | |
|---|---|---|
| CN | 203166515 U | 8/2013 |
| CN | 103414245 A | 11/2013 |
| CN | 103474992 A | 12/2013 |
| CN | 103632313 A | 3/2014 |
| CN | 104242462 A | 12/2014 |
| CN | 104297632 A | 1/2015 |
| CN | 104865474 A | 8/2015 |
| CN | 105224811 A | 1/2016 |
| CN | 105375484 A | 3/2016 |
| CN | 105529704 A | 4/2016 |
| CN | 106383287 A | 2/2017 |
| CN | 106443246 A | 2/2017 |
| EP | 1 830 447 A1 | 9/2007 |
| EP | 1 919 076 A2 | 5/2008 |
| EP | 2 182 207 A2 | 5/2010 |
| KR | 20160038927 A | 4/2016 |
| WO | 2011150247 A1 | 12/2011 |
| WO | 2014061889 A1 | 4/2014 |
| WO | 2017/210124 A1 | 12/2017 |

OTHER PUBLICATIONS

Patent Cooperation Treaty, Written Opinion of the International Searching Authority for PCT/US2017/034765, dated Oct. 9, 2017.

\* cited by examiner

DECOUPLING SYNCHROPHASOR BASED CONTROL SYSTEM FOR DISTRIBUTED ENERGY RESOURCES

CROSS REFERENCE TO RELATED APPLICATION

This application claims is a continuation-in-part of U.S. application Ser. No. 15/168,034, titled "Decoupling Synchrophasor Based Control System for Multiple Distributed Energy Resources," filed May 28, 2016, the contents of which are incorporated herein by reference in its entirety.

TECHNICAL FIELD

The subject matter described herein relates to characterizing attributes of a power system having one or more distributed energy resources.

BACKGROUND

Power systems can generate and distribute electricity to a number of energy consumers or loads. Power generation can result from the conversion of non-renewable and/or renewable resources into electrical energy. Such energy can be distributed to energy consumers and/or loads for consumption. The distribution of electrical energy throughout the power system can involve control systems which can provide control and/or monitor the power flow.

SUMMARY

In one aspect, attributes of a power system having one or more distributed energy resources can be characterized. In particular, data including a power data stream having at least two components and derived from at least one distributed energy resource is continuously received. A control data stream comprising at least two components is continuously generated. The at least two components of the power data stream can be synchronized based on temporal matching of respective components to generate a time synchronized data stream comprising at least two components. An error data stream is determined based on a difference between respective components of the power data stream to components of a reference data stream comprising at least two components. The at least two components of each of the power data stream can include a real power component and a reactive power component. The error data stream and the reference data stream are processed to generate the control data stream. The control data stream is continuously output to enable control and/or monitoring of the power flow of at least one distributed energy resource. The control and/or monitoring of the power flow can include control and/or monitoring of the real power component and/or reactive power component of the power flow.

In some variations, a feedback data stream includes the control data stream and can be combined with the power data stream and the reference data stream to generate the error data stream. The reference data stream can be provided to a first filter, the error data stream to a second filter, and the feedback data stream to a third filter. A difference between the filtered error data stream and the filtered feedback data stream can be provided to a fourth filter. The filtered difference between the filtered error data stream and the filtered feedback data stream can be additively combined with the filtered reference data stream to generate a summed data stream. The summed data stream can be provided to a fifth filter to generate the control data stream. At least one of the first, second, third, fourth, and fifth filters can be at least one of a discrete time filter, a fixed matrix gain filter, a feed forward filter, a high pass filter, or a saturation filter.

In other variations, a prediction data stream can be determined based on the control data stream. A time delay can be injected into the prediction data stream to generate a simulation data stream. The control data stream can be generated based on a processed combination of the error data stream, the prediction data stream, the simulation data stream, and the reference data stream.

In some variations, the power data stream is continuously received from at least one phasor measurement unit (PMU). The power data stream can include a voltage phasor component and a current phasor component output from at least one PMU. In other variations, the power data stream can be continuously received from an instrument capable of sampling and/or supplying at least one phasor measurement.

In some variations, the reference data stream can include a predetermined current component and a predetermined voltage component.

In other variations, one or more distributed energy resources can include at least one of a photovoltaic cell, a battery, a fuel cell, a wind turbine, a combined cycle gas turbine, a sterling engine, an energy storage system, or a generator.

In some variations, point of interest data including data derived from at least two distributed energy resources having a combined power data stream can be continuously received. The power data stream associated with each distributed energy resource from the combined power data stream can be determined. A combined control data stream comprising control data stream associated with each distributed energy resource can be determined.

Systems are also described that include one or more data processors and memory storing instructions which when executed by one or more data processors perform operations described herein. Non-transitory computer program products (i.e., physically embodied computer program products) are also described that store instructions, which when executed by one or more data processors of one or more computing systems, cause at least one data processor to perform operations described herein. The memory may temporarily or permanently store instructions that cause at least one processor to perform one or more of the operations described herein. In addition, methods can be implemented by one or more data processors either within a single computing system or distributed among two or more computing systems. Such computing systems can be connected and can exchange data and/or commands or other instructions or the like via one or more connections, including but not limited to a connection over a network (e.g., the Internet, a wireless wide area network, a local area network, a wide area network, a wired network, or the like), via a direct connection between one or more of the multiple computing systems, etc.

The subject matter described herein provides many technical advantages. For example, the current subject matter provides for the use of linear control algorithms for phasor control. Such control provides an ability to maintain decoupling of a phasor amplitude and power angle of a phasor pair. The subject matter further provides an ability to determine power flow at a point of interest in an energy power system.

The details of one or more variations of the subject matter described herein are set forth in the accompanying drawings and the description below. Other features and advantages of

DESCRIPTION OF DRAWINGS

Like reference symbols in the various drawings indicate like elements.

DETAILED DESCRIPTION

An electric power system (EPS) can be made up of, for example, one or more distributed energy resources (DERs) which include renewable and/or non-renewable energy resources. Example non-renewable DERs can include combined cycle gas turbines, sterling engines, diesel motors or thermal energy sources that can generate power using, for example, gasoline, oil or natural gas and other combustible material (e.g., garbage, bagasse or other organic material). Examples of renewable energy resources can include photovoltaic cells, fuel cells, wind turbines or hydroelectric dams. In addition, DERs can also be batteries or other energy storage systems such as electric vehicle charging systems that have the ability to store or produce electric energy.

Low inertia systems can be difficult to control compared to systems with high inertia from rotating energy sources due to the lack of a rotating mass to absorb intermittency and load disturbances in the grid. Lack of control of the power characteristics of one or more DERs can cause large variations in frequencies and/or voltages to a larger power grid. For example, the DER frequencies and/or voltages can exceed grid power standards causing the DER to disconnect from the area EPS. With adequate control and coordination, one or more DERs can form the basis of a microgrid power system to help stabilize the grid.

Figure 1:
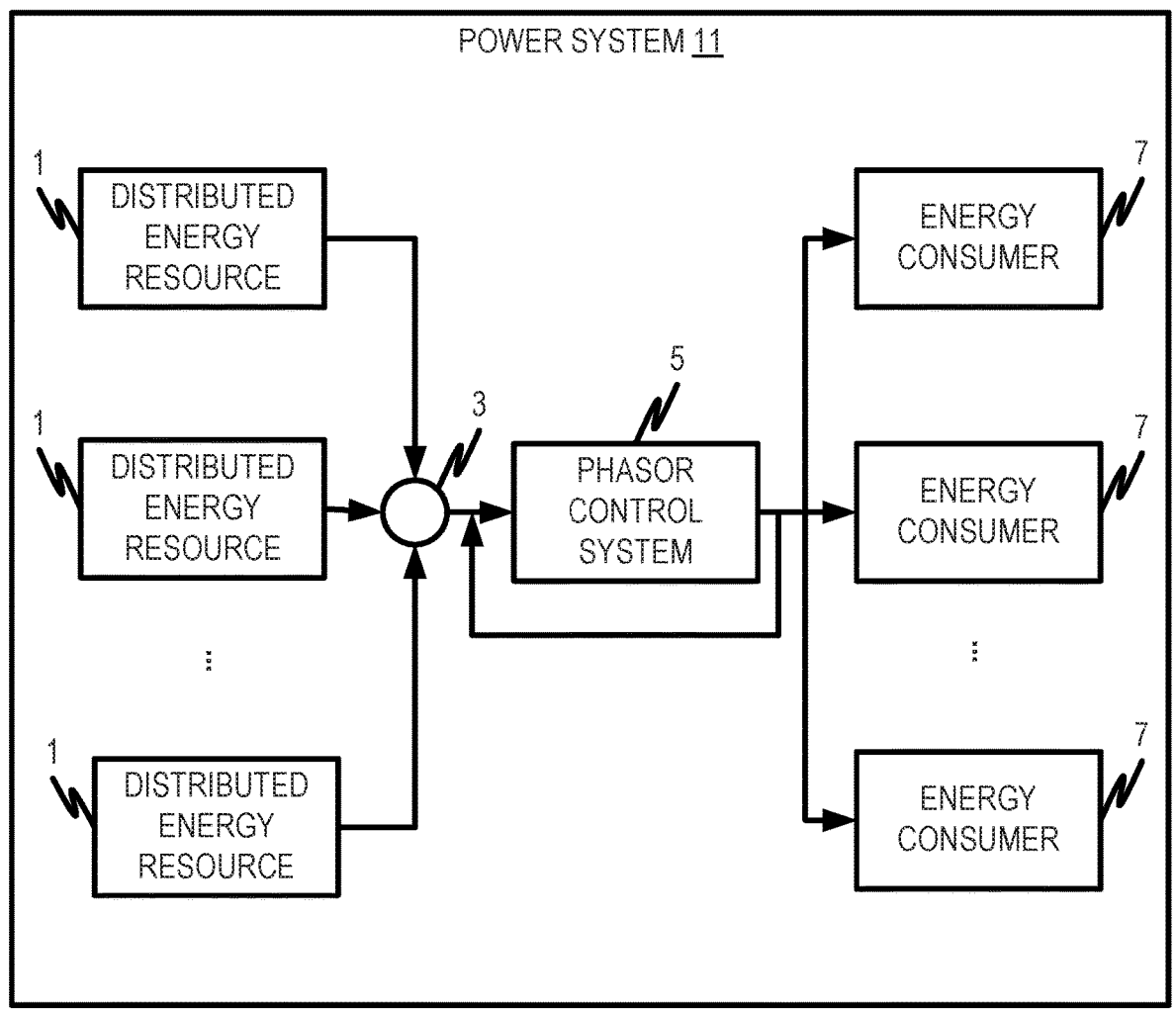
FIG. 1 is a system block diagram illustrating a power system having one or more distributed energy resources and one or more energy consumers.

FIG. 1 is a system block diagram illustrating an example power system 11 having one or more distributed energy resources 1 controlled by a phasor control system 5. DER 1 can be, for example, one or more of: a photovoltaic cell, a battery, a fuel cell, a wind turbine, a combined cycle gas turbine, a sterling engine, an energy storage system, or a generator. One or more DERs 1 can have individual power data streams that collectively come together at a Point of Interest (POI) 3 (e.g., point of interconnection). Power system 11 can also have more than one POI 3. A combined power data stream that can continuously flow to a phasor control system 5. A power data stream associated with each distributed energy resource from the combined power data stream can be determined. The phasor control system 5 can perform various operations as described herein to generate a control data stream for one DER or a combined control data stream from multiple DERs to one or more energy consumers 7. The control data stream output by the phasor control system 5 can be fed back as a feedback data stream and combined with the power data stream and a reference data stream (not shown) to generate an error data stream.

The electric behavior at a POI 3 in a single phase or a balanced phase (e.g., positive sequence), alternating current (AC) electric power system can be characterized by a voltage as a function of time represented by:

$$v(t)=V \sin(2\pi f t+\beta) \qquad (1)$$

and a current as a function of time represented by:

$$i(t)=I \sin(2\pi f t+\gamma) \qquad (2)$$

where V is the AC voltage magnitude, $\beta$ is a voltage angle, f is a frequency measured in Hz, t represents time, I is the AC current magnitude, and $\gamma$ is a current angle. A voltage phasor can be represented by:

$$v=(V,\beta) \qquad (3)$$

or by the complex vector representation:

$$v=Ve^{j\beta} \qquad (4)$$

where j is a complex number and follows:

$$j^2=-1. \qquad (5)$$

A current phasor can be represented by:

$$i=(I,\gamma) \qquad (6)$$

or the complex vector representation:

$$i=Ie^{j\gamma}, \qquad (7)$$

of which Equations (4) and (7) by:

$$S=VI^* \qquad (8)$$

where S is the apparent, complex power and I* is the complex conjugate current. The voltage phasor, v, of Equation (4), and current phasor, i, of Equation (7) can be used to obtain derivative information. The derivative information can include, for example, a real power component, P, and a reactive power component, Q. The real power component, P, and reactive power component, Q, can characterize the electrical power flow from, through, or into an impedance, Z, located in the EPS 11.

An EPS 11 can have components which can be represented by one or more impedances. Impedance plays a role in Ohm's law. Where the EPS 11 is a linear, dynamic system, the impedance, Z, can be represented by:

$$Z=|Z|e^{j\gamma} \qquad (9)$$

where $\theta$ is a phase shift, and j is an imaginary number. With the notion of a complex impedance, Z, Ohm's law for a linear, dynamic system states that the voltage phasor, v, of Equation 4, and current phasor, i, of Equation 7 are related via the relationship (e.g., Ohm's law):

$$v=Zi. \qquad (10)$$

This makes the AC voltage magnitude, V, related to the current magnitude, I, via the relationship:

$$V=|Z|I,$$

and the voltage angle, β, is related to the current angle, γ, via the relationship:

$$\beta=\theta+\gamma, \quad (12)$$

due to the complex calculation of Equation (9). The impedance, Z, in an EPS 11 can refer to, but is not limited to, an electrical source producing electrical power, an electrical line transporting electrical power, or an electrical load consuming electrical power.

The impedance, Z, between a location a and a location b in an EPS 11 can be determined and characterized by its amplitude, $|Z|$, and its phase angle, θ. The real power component, P, and reactive power component, Q, flowing through the known impedance from location a to location b can be computed using:

$$P = \frac{V_a V_a}{2|Z|}\cos(\theta) - \frac{V_a V_b}{2|Z|}\cos(\theta-\delta) \quad (13)$$

and $$Q = \frac{V_a V_a}{2|Z|}\sin(\theta) - \frac{V_a V_b}{2|Z|}\sin(\theta-\delta) \quad (14)$$

where $V_a$ and $V_b$ are the voltage amplitudes respectively at location a and location b and where $$\delta=\beta_b-\beta_a \quad (15)$$

with $\beta_b$ being the voltage phase angle at location b and $\beta_a$ being the voltage phase angle at location a. Equations (13) and (14) indicate that real power component, P, and reactive power component, Q, power flow between two locations a and b in an EPS 11 can be derived from the equivalent impedance, Z, between the two locations in the power grid and the voltage phasor measurements represented by:

$$v_a=(V_a,\beta_a) \quad (16)$$

and $$v_b=(V_b,\beta_b), \quad (17)$$

respectively at the two locations a and b in the EPS 11.

In controlling and monitoring the power flow at a particular POI 3 in an EPS 11, both the voltage phasor and the current phasor can be used to compute the real power component, P, and reactive power component, Q. A particular POI 3 in the EPS 11 can include, but are not limited to, the location of a DER 1 in the EPS 11 or POI 3 in the EPS 11 that can include the POI 3 where a local EPS 11 connects to the main EPS (not shown). The real power component, P, and reactive power component, Q, flow at a POI can be computed by:

$$P = \frac{VI}{2}\cos(\alpha) \quad (18)$$

and $$Q = \frac{VI}{2}\sin(\alpha) \quad (19)$$

where V is the voltage amplitude and I is the current amplitude at the POI 3, and where α is the power angle represented by:

$$\alpha=\beta-\gamma. \quad (20)$$

The power angle is related to the normalized size and direction of the real power component, P, and reactive power component, Q, with the relationships $$\cos(\alpha) \quad (21)$$

and $$\sin(\alpha) \quad (22)$$

in a range between −1 and 1. Based on the power angle, α, a current power phasor, $I_p$, represented by:

$$I_p=Ie^{j\alpha} \quad (23)$$

can combine the information on the current amplitude, I, and power angle, α. The computation of real power component, P, and reactive power component, Q, can also be extended to common three phase AC system where three voltage and current phasors for each phase are available.

Conversely, given a real power component and reactive power component pair (P, Q) at a POI 3 in the EPS 11, the power angle, α, of Equation (20), and the product VI of the voltage amplitude, V, and current amplitude, I, and can be computed by:

$$\alpha=a\tan 2(Q,P) \quad (24)$$

and $$VI=2\sqrt{P^2+Q^2} \quad (25)$$

where a tan 2( ) denotes the four quadrant inverse tangent, creating a power phase angle, α, in the interval between −π and π radians. Equations (24) and (25) demonstrate that the real power component and reactive power component pair [P, Q] is not sufficient to reconstruct information on the voltage phasor and/or the current phasor. Only the difference for the power angle, α, of Equation (20), between the voltage angle, β, and the current angle, γ, and the product which represents the apparent power, S, represented by:

$$|S|=VI \quad (26)$$

where the voltage amplitude, V, and current amplitude, I, can be reconstructed. However, additional information on the voltage phasor or the current phasor suffices to reconstruct the phasor pair [v, i] from real and reactive power pair [P, Q].

For notational convenience, the inverse operation from the real and reactive power pair [P,Q] back to information on the phasors is denoted by the function invPQ( ). The information on the phasors computed by the function invPQ( ) can use information on the voltage phasor or the current phasor.

Using polar phasor current control, the function operation $$[I,\alpha]=invPQ(P,Q) \quad (27)$$

can refer to the computation of the polar coordinates [I, α] representing the power angle, α, and the current amplitude, I, of the complex power current of Equation (23) computed from information of the real power component, P, and reactive power component, Q, according to:

$$\alpha=a\tan 2(Q,P) \quad (28)$$

and $$I=2/V\sqrt{P^2+Q^2}. \quad (29)$$

A rectangular current phasor control can be represented by:

$$[I_c, I_s] = \text{invPQ}(P, Q) \tag{30}$$

where:

$$I_c = I \cos(\alpha) \tag{31}$$

and the imaginary part represented by:

$$I_s = I \sin(\alpha). \tag{32}$$

where:

$$I_c = 2P/V \tag{33}$$

and $$I_s = 2Q/V \tag{34}$$

where:

$$V \neq 0. \tag{35}$$

Phasor Measurement Units (PMUs) are devices which can measure electric properties of a power system. PMUs as provided herein can have a common time source which provides for time synchronization data streams by temporally matching each component of a power data stream. The use of PMUs in a control system can provide a number of advantages. One advantage of using phasor representation for feedback is that it allows the use of linear control algorithms for controlling of the phasor and the resulting power flow in an EPS 11. Due to the fact that phasors at different locations in an EPS 11 can be linearly or dynamically related, the linear relation can provide an impedance, Z, between the phasors of a linear, dynamic system. However, even if the impedance, Z, is a linear dynamic impedance, a real power component, P, and a reactive power component, Q, can have a non-linear relation due to the product of voltage phasor, v, and current phasor, i. For example, the voltage phasor, $v_{out}$, over a load modeled by the impedance, $Z_L$, and produced by a voltage source, $v_{in}$, with a line impedance, $Z_{in}$, can be represented by:

$$v_{out} = Z v_{in} \tag{36}$$

where $$Z = \frac{Z_L}{Z_L + Z_{in}} \tag{37}$$

Another advantage of using phasor representation for feedback is ability to maintain decoupling of a phasor amplitude and power angle pair. For example, the real power component, P, and reactive power component, Q, can be a trigonometric statically coupled pair [P, Q] and related via apparent power, S, which can be represented by:

$$S = P + jQ. \tag{38}$$

Increasing the size of the absolute value of the apparent power, |S|, can be done by increasing the real power component, P, or the reactive power component, Q. However, in order to maintain the same ratio between the real power component, P, and the reactive power component, Q, changes in the real power component, P, can be coupled to the changes in the reactive power component, Q. The real power component and reactive power component are treated as a coupled pair during power control. Using a PMU to generate a feedback data stream, and in particular using the current amplitude/power angle pair [I, α] or the voltage amplitude/power angle pair [V, α] allows for the decoupling between a phasor amplitude and power angle pair.

Yet another advantage for using phasor representation for feedback data stream provides is the ability to calculate power flow at a particular POI 3 in an EPS 11. This is due to the fact that the PMU output pair [v, i] can contain more information than the real power component and reactive component pair [P, Q]. The power flow information represented by the real power component and reactive power component pair [P, Q] may not contain substantial information about the voltage phasor represented by Equations (3) or (4) and/or current phasor represented by Equations (6) or (7), where the phase difference defines a power angle, α, represented by Equation (20). The product VI of the voltage amplitude, V, and current amplitude, I, can be reconstructed from the real power component and reactive power component pair [P, Q] using Equation (26). The individual voltage phasor of Equation (3) and current phasor Equation (6) can also contain information about the individual voltage amplitude, V, current amplitude, I, voltage angle, β, and current angle, γ, useful for voltage angle or current angle tracking control systems.

The local EPS 11 can include a number of protective relays, in particular across the circuit breaker separating the area EPS from the local EPS. Relays can include PMU calculations and provide these measurements at high data rates (e.g., 60 Hz) to multiple clients. The controller subscribes to these PMU measurement streams to obtain the measurements needed for control. There are certain time delays in receiving the data; hence the need for the Smith Predictor functionality (e.g., deadtime compensated control). In other implementations, where electromechanical relays can be used, a new PMU measurement device is installed at the required location in the grid. These PMUs can send the measurements to the controller using the same message protocols as used by the relays.

Figure 2:
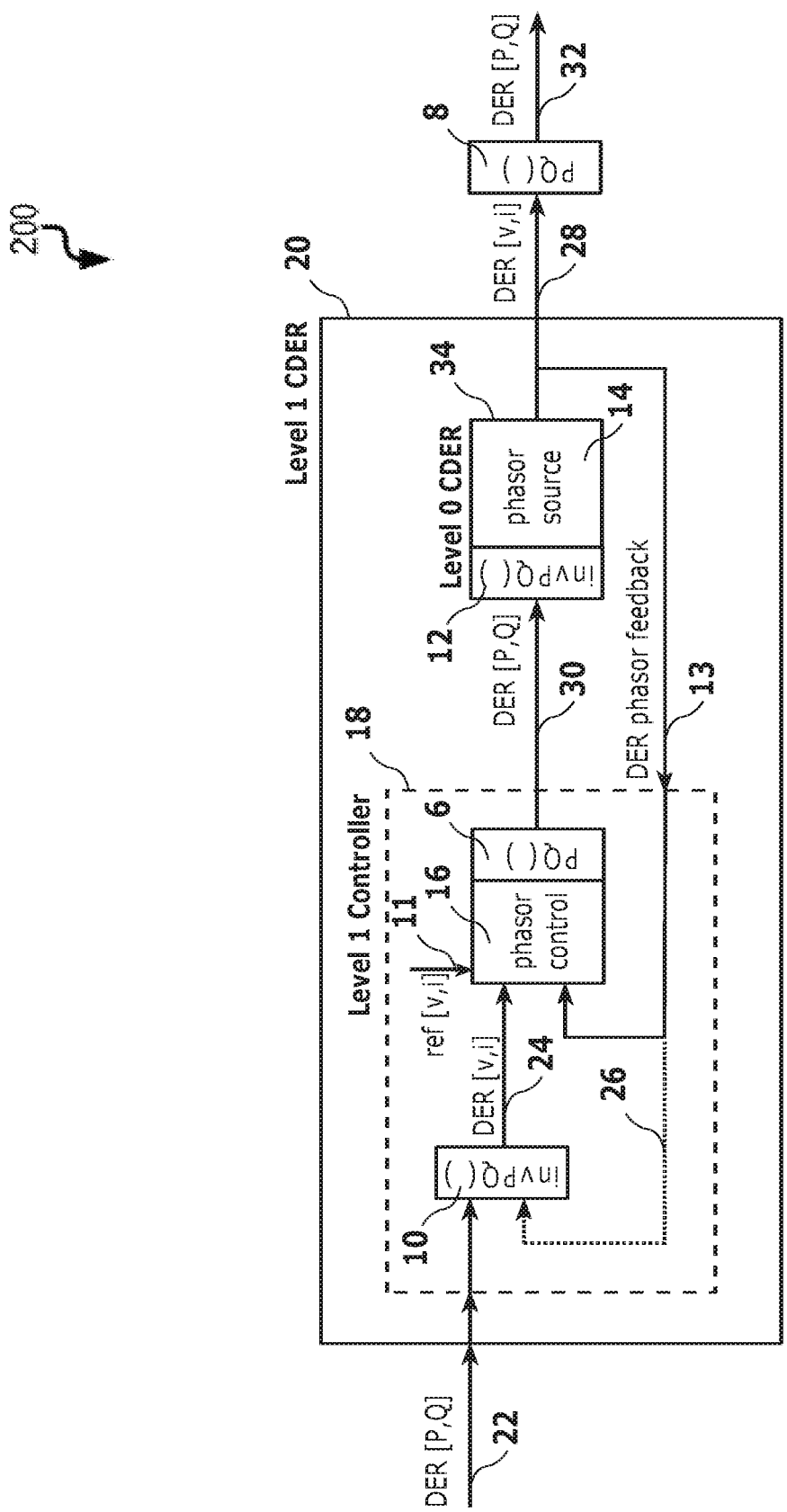
FIG. 2 is a system block diagram illustrating a Level 1 phasor controlling one DER having a feedback data stream.

FIG. 2 is a system block diagram 200 illustrating a Level 1 phasor controlling one DER having a feedback data stream. The Level 1 indication can be used to distinguish a hierarchical controller structure. The control algorithm depicted in FIG. 2 can use real-time, continuous feedback data stream measurements of the voltage and/or current phasors to provide a control data stream. The control data stream can control the real power component and reactive power component pair (P, Q) at a POI in an EPS. The series connection of the invPQ( ) function block 12 and the phasor source 14 can be represented as Level 0 Controlled DER (CDER) 34 to distinguish this DER at the lower level 0 from the phasor controlled DER at a higher level 1.

The power data steam 22 can include a real power component, P, and a reactive power component, Q. The power data stream 22 can be converted into a phasor input data stream 24 via the invPQ( ) function block 10 which provides a voltage component and current component representation of the real power component and reactive power component of power data stream 22 using, for example, the inverse of Equations (18)-(20). The resulting phasor input data stream 24 can have a voltage phasor component and current phasor component. The invPQ( ) function block 10 requires information on either the voltage phasor of Equation (3) or the current phasor of Equation (6) indicated by the dotted phasor information signal 26. For example, the voltage magnitude, V, can be used to compute the voltage phasor, v, and current phasor, i according to Equation 33 or Equation 34. The invPQ( ) function block 10 can be, for an example, a PMU or an instrument capable of sampling and/or supplying at least one phasor measurement.

The phasor input data stream 24 produced by the invPQ( ) function block 10 can alter the data used in the internal phasor control 16. In one instance, for example, polar phasor current control can be used for the internal phasor control 16. Using polar phasor current control, polar coordinates can be determined using Equations (27)-(29). In another example, rectangular current phasor control can be used following Equations (30)-(35).

Phasor input data stream 24, reference data stream 11, and feedback data stream 13 can be provided to the phasor control 16 as inputs for processing in order to generate the control data stream (not shown) between phasor control 16 and PQ( ) function block 6. Reference data stream 11 can include, for example, a predetermined voltage component and a predetermined current component. In some alternatives, reference data stream 11 can include, for example, a predetermined real power component and a predetermined reactive power component. More details on the inner workings of phasor control 16 is included in the discussion of FIGS. 5-6.

The control data stream computed by the algorithms in phasor control 16 can be then converted again to a power input data stream 30 via the PQ( ) function block 6 following Equations (18)-(20). The power input data stream 30 can include a real power component, P, and a reactive power component, Q, and can be processed by the invPQ( ) function block 12 and the phasor source 14 to produce a control data stream 28 having a voltage component and a current component. The control data stream 28 can continuously output to enable control and/or monitoring of the power flow of at least one DER. Additionally, the control data stream 28 can be fed back to the Level 1 controller 18 as a feedback data stream 13. The feedback data stream 13, can be combined with the phasor form of power data stream 22 (e.g., phasor input data stream 24) for further processing by phasor control 16. Both the feedback data stream and control data stream, being one in the same, include a voltage component and a current component. In some alternatives, control data stream 28 can be converted back to having a real power component and reactive power component PQ( ) function block 8 to produce a power control data stream 32. The PQ ( ) function block 8 given can also be used to compare the tracking performance of the real and reactive power components of power control data stream with respect to the real and reactive power components of power data stream 22.

Having a separate PQ ( ) function block 8 from the phasor source 14 and providing direct phasor feedback via feedback data stream 13 having voltage and current components allows for more information to be brought into the Level 1 controller 18. Both voltage angle, β, and current angle, γ, are both available as decoupled feedback rather than just a power angle. Furthermore, the separation allows the dynamics of the control algorithm in the phasor control 16 to be designed on the basis of the dynamics of the phasor source 14.

Figure 3:
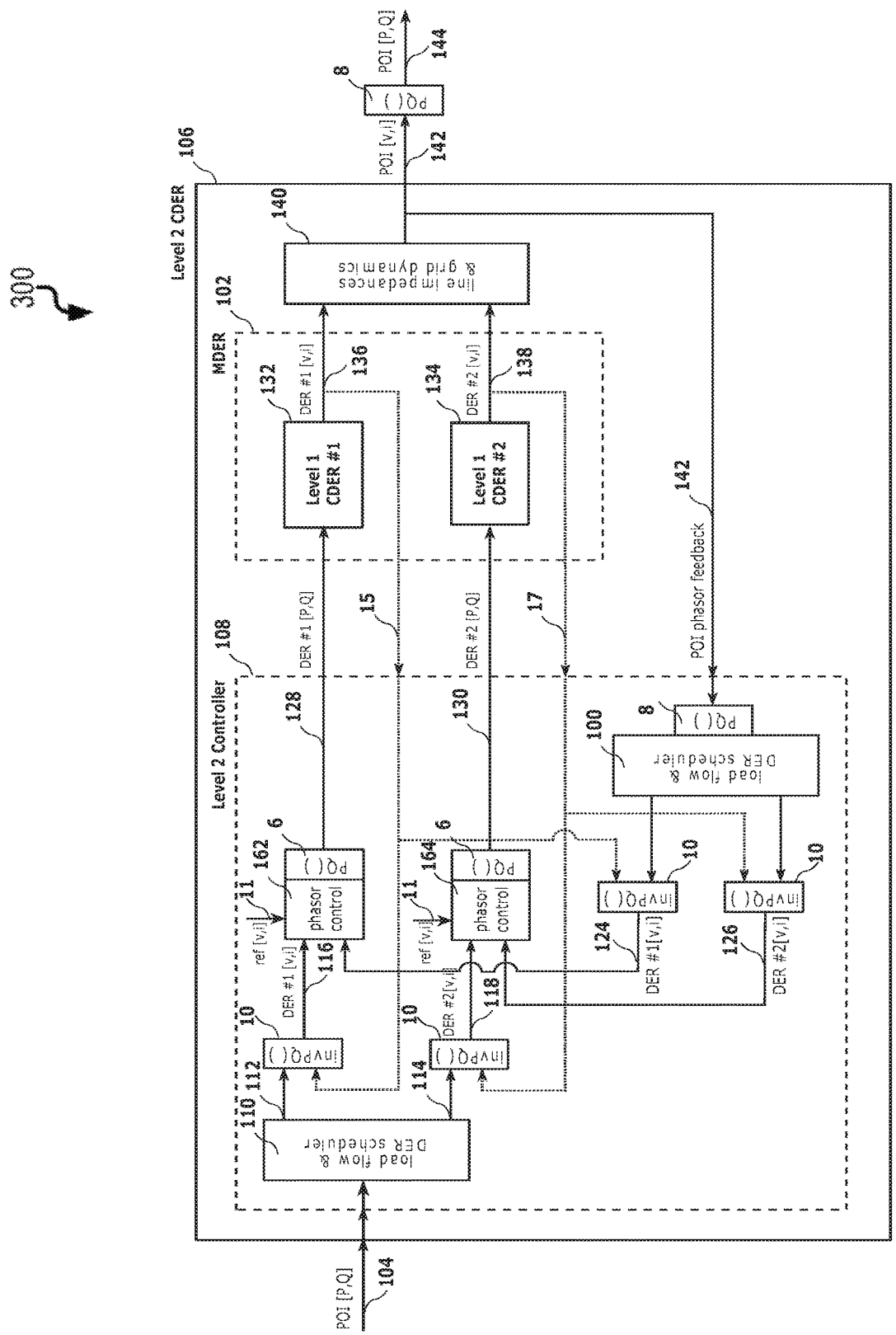
FIG. 3 is a system block diagram illustrating a Level 2 phasor controlling multiple DERs.

FIG. 3 is a system block diagram 300 illustrating a Level 2 CDER 106. Multiple Distributed Energy Resources (MDER) 102 illustrates that each DER contributing to a POI have a respective Level 1 CDER 20 applied in parallel and can be controlled by a Level 2 Controller 108 (e.g., Level 1 CDER #1 132 and Level 1 CDER #2 134). A point of interest data stream 104 can be continuously received by Level 2 Controller 108. The load flow & DER scheduler 110 can include an algorithm that decides which DERs participate in the level 2 control and at an appropriate contribution percentage. Logic and/or load flow calculations can also be included in the load flow & DER scheduler functional block 110.

Power data streams having real and reactive power components can be determined by load flow & DER scheduler functional block 110 and output as power data stream 112 and power data stream 114. Power data streams 112 and 114 can then be each converted using invPQ( ) function blocks 10 to generate phasor input data streams 116 and 118, respectively. Phasor input data streams 116 and 118 are phasor representations having a voltage phasor component and a current phasor component representing the input power data streams 112 and 114, respectively.

To use the individual phasor input data streams 116 and 118 for control in each phasor control 162 and 164, each phasor input data stream 116 and 118 can be compared to individual phasor feedback signals 124 and 126, respectively. Since the separation of the individual phasor input data streams 116 and 118 were generated by the load flow & DER scheduler functional block 110, the individual feedback data streams 124 and 126 are generated by the substantially similar algorithm as used in the load flow & DER scheduler functional block 100.

For that purpose, a combined control data stream 142 having a voltage phasor component and a current phasor component is first sent through the PQ( ) functional block 8 to convert combined control data stream 142 into a data stream having real and reactive power components that are then subjected to the load flow & DER scheduler 100. For the conversion back to the individual feedback data streams 124 and 126, the invPQ( ) function blocks 10 are used and require information on either the voltage phasor or the current phasor of each CDER indicated by the phasor information signals 15 and 17, respectively. These phasor information signals are analogous to the feedback data stream 13.

The input data streams 116 and 118 and the feedback data streams 124 and 126 enter the two individual phasor control 162 and 164 blocks in order to compute each power input data stream 128 and 130. In some alternatives, the functional block of the phasor control 162 and 164 can have the same control algorithms as used in FIG. 2 for phasor control 16, but can have different numerical values for the control algorithm, depending on the dynamics of the level 1 CDER to be controlled at level 2. For example, the Level 1 CDER #1 132 can refer to the fast dynamics on a battery/inverter system, while the Level 1 CDER #2 134 can refer to the slower dynamics on a gas turbine/generator system. Due to the difference between in dynamics between Level 1 CDER #1 132 and Level 1 CDER #2 134, the phasor control 162 and 164 for each Level 1 CDER can be similar in terms of algorithms, but different in terms of the numerical values used in the algorithms. Phasor control 162 and 164 can also have reference data stream 11 inputs. More details on the inner workings of phasor control 162 and 164 block is included in the discussion of FIGS. 5-6.

The phasor control signal computed by the algorithms in the individual phasor control 162 and 164 blocks can then be converted to DER power input data streams 128 and 130 via the PQ( ) function blocks 6. The DER power input data stream 128 can be processed by the Level 1 CDER #1 132 to an output control signal 136 having a voltage component and a phasor component. Similarly, the DER power input control data stream 130 can be processed by the Level 1 CDER #2 134 to generate an output control data stream 138. The processing by the Level 1 CDER #1 132 or Level 1

CDER #2 134 has the same generic functionality as the Level 1 CDER 20 defined earlier in FIG. 2.

The aggregated effect of the output data streams 136 and 138 can be combined via the functional block representing the line impedances & grid dynamics 140 and generates a combined controlled data stream 142. The line impedances & grid dynamics 140 in FIG. 3 can represent the interconnections and electrical parameters of the EPS that would lead to the combined controlled data stream 142 due to changes in the output control data streams 136 and 138 produced by the Level 1 CDER #1 132 and Level 1 CDER #2 134. The combined output data stream 142 can be fed back to the Level 2 controller 108 for continuous monitoring of phasor behavior and control power flow. Although not essential for the feedback operation of the Level 2 controller 108, the combined control data stream 142 having voltage and current components can be converted back to a POI data stream 144 having real and reactive power components via the PQ( ) function block 8. The PQ( ) function block 8 can be used to compare the tracking performance of POI data stream 144 with respect to the real/reactive power combined power data stream 104.

Figure 4:
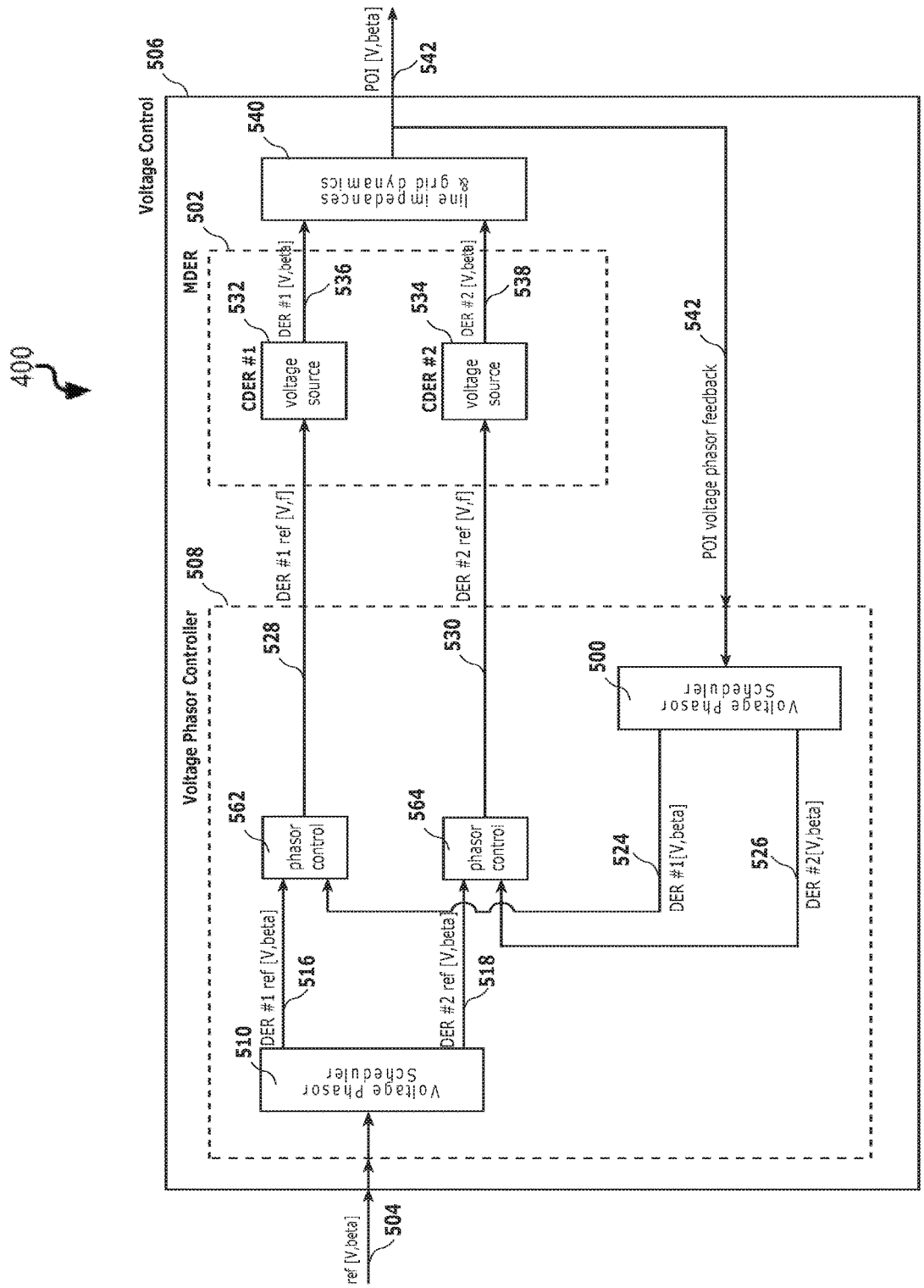
FIG. 4 is a system block diagram illustrating a voltage phasor controlling multiple DERs.

FIG. 4 is a system block diagram 400 illustrating a voltage phasor controlling multiple DERs. Tracking the voltage amplitude, V, and voltage angle, β, voltage input data stream 504 at a POI of the EPS and especially the Point of Common Coupling (PCC) of the EPS, in case the EPS is disconnected from the main grid. Tracking the voltage amplitude, V, and voltage angle, β, of the main grid as a voltage input data stream 504 allows for connection and disconnection of the EPS for islanding operations. Similar to FIG. 3, parallel placed CDERs in a single MDER 502 are now controlled by the Voltage Phasor Controller 508. FIG. 4 shows that the MDER 502 has two parallel placed CDERs and labeled CDER #1 532 and CDER #2 534. However, there can also be single or multiple instances of the CDERs.

It can be observed that the Voltage Phasor Controller 508 has a substantially similar generic functionality as the Level 2 CDER 108 in FIG. 3. However, the PQ ( ) and invPQ( ) function blocks are removed. The phasor control 562 and 564 in FIG. 4 have a substantially similar generic functionality the phasor control 162 and 164 in FIG. 3 promoting modularity of the control architecture.

The voltage phasor reference signal 504 feeds into the Voltage Control 506 and then into the Voltage Phasor Controller 508. In the Voltage Phasor Controller 508 the voltage phasor reference data stream 506 can be separated into individual voltage phasor reference data streams 516 and 518 by the Voltage Phasor Scheduler functional block 510.

The Voltage Phasor Scheduler 510 can include an algorithm that decides which DERs participate in the voltage phasor control and at what percentage they will contribute. Logic and/or load flow calculations can also be included in the Voltage Phasor Scheduler functional block 510.

To use the individual voltage phasor reference signals 516 and 518 for control in the phasor control 562 and 564, the voltage phasor reference signals 516 and 518 can be compared to individual voltage phasor measurement data streams 524 and 526, respectively. Since the separation of the individual phasor voltage reference signals 516 and 518 were generated by the Voltage Phasor Scheduler functional block 510, the individual voltage phasor measurement data streams 524 and 526 are generated by a substantially similar algorithm as used in the Voltage Phasor Scheduler functional block 510 duplicated in FIG. 3 as block 110 with the input of the POI voltage phasor feedback measurement data stream 542.

The phasor reference data streams 516 and 518 and the phasor feedback data streams 524 and 526 enter the two individual phasor control 562 and 564 blocks to generate a phasor control data streams 528 and 530 having a voltage component and a frequency component of the voltage phasor. Conversion to frequency can be done to accommodate the input to the voltage sources CDER #1 532 and CDER #2 534 that again produce a voltage phasor data stream 536 and voltage phasor data stream 538. CDERs such as inverters can allow for independent specification of voltage amplitudes, V, and frequencies, f, of the AC voltage signal. The phasor controls 562 and 564 can have the same control algorithms as used in FIG. 3 phasor control 162 and 164 but can have different numerical values for the control algorithm, depending on the dynamics of the CDER to be controlled. More details on the inner workings of phasor control 562 and 564 block is included in the discussion of FIGS. 5-6.

The aggregated effect of the voltage phasor data stream 536 produced by the voltage source CDER #1 532 and the voltage phasor data stream 538 produced by the voltage source CDER #2 534 can be combined via the functional block representing the line impedances & grid dynamics 540 and results in a measurable voltage phasor data stream 542 at the POI. The line impedances & grid dynamics 540 in FIG. 4 can represent the interconnections and electrical parameters of the EPS that would lead to the POI phasor data stream 542 due to changes in the phasor output data streams 536 and 538 produced by the voltage sources CDER #1 532 and CDER #2 534. The voltage phasor data stream 542 at the POI can again fed back to the Voltage Controller 508 for continuous monitoring of voltage phasor behavior and track voltage amplitude, V, and voltage angle, β, power flow.

Figure 5:
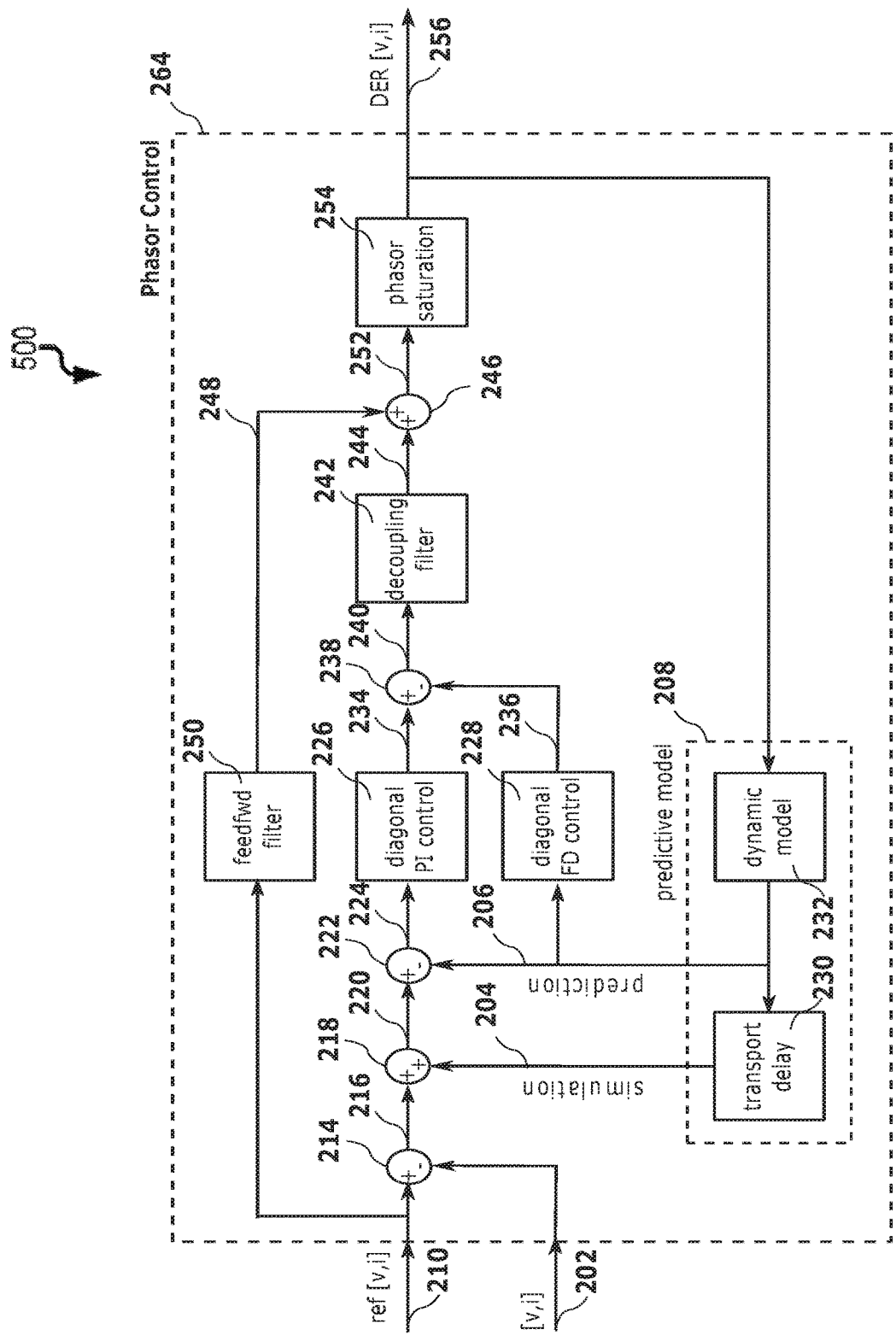
FIG. 5 is a system block diagram illustrating control algorithms of a phasor controller of one or more DERs.

FIG. 5 is a system block diagram 500 illustrating control algorithms of a phasor controller of one or more DERs. Phasor control 264 can have at least two-inputs and two-outputs, with the input and outputs decoupled from one another. A control data stream 256 can be generated from a reference data stream 210 and a power data stream 202. As previously described, the power data stream 202 can be derived from a DER and converted from having real and reactive power components to having current and voltage power components. The phasor control 264 can also include a simulation data stream 204 and a prediction data stream 206 produced by a predictive model 208 to account for transport delay in obtaining the power data stream 202. Alternatively, the phasor control 264 can be given in the phasor control 364 in FIG. 6 where the predictive model 208 has been eliminated.

Both the reference data stream 210 and the power data stream 202 enter the phasor control 264. As previously described, power data stream 202 can include a feedback data stream of control data stream 256. In comparison with FIG. 3, the reference data stream 210 can represent the reference data stream 11 of FIG. 2.

The difference between the reference data stream 210 and the power data stream 202 can be computed using difference junction 214 to determine a difference data stream 216. The simulation data stream 204 can be additively combined with the difference data stream 216 using the summing junction 218 to generate a simulation error data stream 220. Subsequently, the difference between the simulation error data stream 220 and the prediction data steam 206 produced by the difference junction 222 determines the error data stream 224. Error data stream 224 can be provided into a diagonal Proportional Integral (PI) controller 226. In one aspect, diagonal PI controller 226 can provide the computation of the PI control output data stream 234 as the sum of a proportional gain $K_p$ amplified error data stream 224 and an integral gain $K_i$ amplified time integrated error data stream 224. Other examples can include other linear combinations of a gain amplified error data stream 224 and time integrated control error data stream 224 implemented in discrete-time filters.

In parallel, the prediction data stream 206 can be provided into the diagonal Filtered Derivative (FD) controller 228. In one alternative, the diagonal FD controller 228 can be the computation of the FD control output data stream 236 as a derivative gain $K_d$ amplified filtered prediction data stream 206. In another alternative, the diagonal FD controller 228 can be a derivative gain $K_d$ amplified filtered power data stream 202 implemented in discrete-time filters. The derivative can operate on the feedback data stream or the prediction data stream 206. The derivative contribution is unaffected by set point changes that cause large output changes.

If the predictive model 208 provides an substantially accurate simulation that includes substantially the same transport delay 230 and substantially the same dynamics modeled by the dynamic model 232 as seen in the power data stream 202, then the simulation error data stream 220 would be zero and only the prediction data stream 206 will appear in the error data stream 224. Since the prediction data stream 206 can be equivalent to the simulation data stream 204, but without the transportation delay, the effect of transport delay in the power data stream 202 can be compensated for, as only the prediction data stream 206 can appear in the error data stream 224 fed into the diagonal PI controller 226. At the same time, the same prediction data stream 206 can be fed into the diagonal FD controller 228. As a result, the predictive model 208 also known can be used for the decoupling synchrophasor based control algorithm used in the phasor control 264. Predictive model 208 can be a Smith predictor model.

Given the fact that the error data stream 224 includes at least a voltage component and a current component, the diagonal PI controller 226 can be a PI controller that operates on each of the two components included in the two dimensional error data stream 224 independently. The independent operation maintains decoupling between each of the two components of the data stream included in the two dimensional error data stream 224. Similarly, the diagonal FD controller 228 can be a FD controller that operates on each of the two components included in the two dimensional prediction data stream 206 or the power data stream 202 independently. The independent operation maintains decoupling between each of the two components of each data stream included in the two dimensional error data stream 224.

Further decoupling can be accomplished in the phasor control 264 by sending a linear combination of the PI control output data stream 234 and the FD control output data stream 236 produced by the difference or summing junction 238 as a difference data stream 240 to a multi-input, multi-output decoupling filter 242. The decoupling filter 242 can include an output filter that can adjust the output signal according to the characteristics of the DER. Decoupling filter 242 can also be a multivariable dynamic system that aims to decouple the feedback data stream either at the DER at Level 1 or at the POI at Level 2 control. The decoupling and output filters can be combined into one filter for each of the elements in the decoupling matrix. This takes into account the dynamic decoupling and the output filters. The output filter can be used to remove signals that the DER would not be able to respond to. For example, a rotating generator may not be able to respond to a 60 Hz varying signal, so this high frequency information can be filtered out for this device. On the other hand, an inverter can respond to high frequency commands, and thus its output filter can be a high pass filter. That is, it filters out the low frequency content of the output signal. Thus, fast control signals go to inverters and slow control signals go to generators. Alternatively, the decoupling filter 242 can be configured to accept two single input and single output (SISO) controllers.

The filtered difference data stream 244 of the decoupling filter 242 can be combined by the summing junction 246 with the feed forward data stream 248 produced by the feed forward filter 250. The feed forward filter 250 can take the reference data stream 210 to generate the feed forward data stream 248. The feed forward filter 250 in the phasor control 264 allows the control signals to directly respond to any changes in the reference data stream 210 without first having to go through the diagonal PI controller 226 and can allow for a faster phasor control in response to set point changes in the reference data stream 210. The feed forward filter 250 can have the same generic functionality as the decoupling filter 242, a multivariable dynamic system that also aims to decouple the real and reactive data streams either at the DER at Level 1 or at the POI at Level 2 control. Alternatively, the feed forward filter 250 can be a fixed matrix gain to maintain or promote statically decoupled feedback data stream either at the DER at Level 1 or at the POI at Level 2.

The final stage of the phasor control 264 can be to send the summation data stream 252 obtained by summing junction 246 to a phasor saturation 254 to limit the control data stream 256. The phasor saturation can limit the range or rate of change of the power angle, $\alpha$, the maximum current amplitude, I, and/or the maximum and minimum rectangular coordinates or any variations of these data streams and/or corresponding rates of change.

Figure 6:
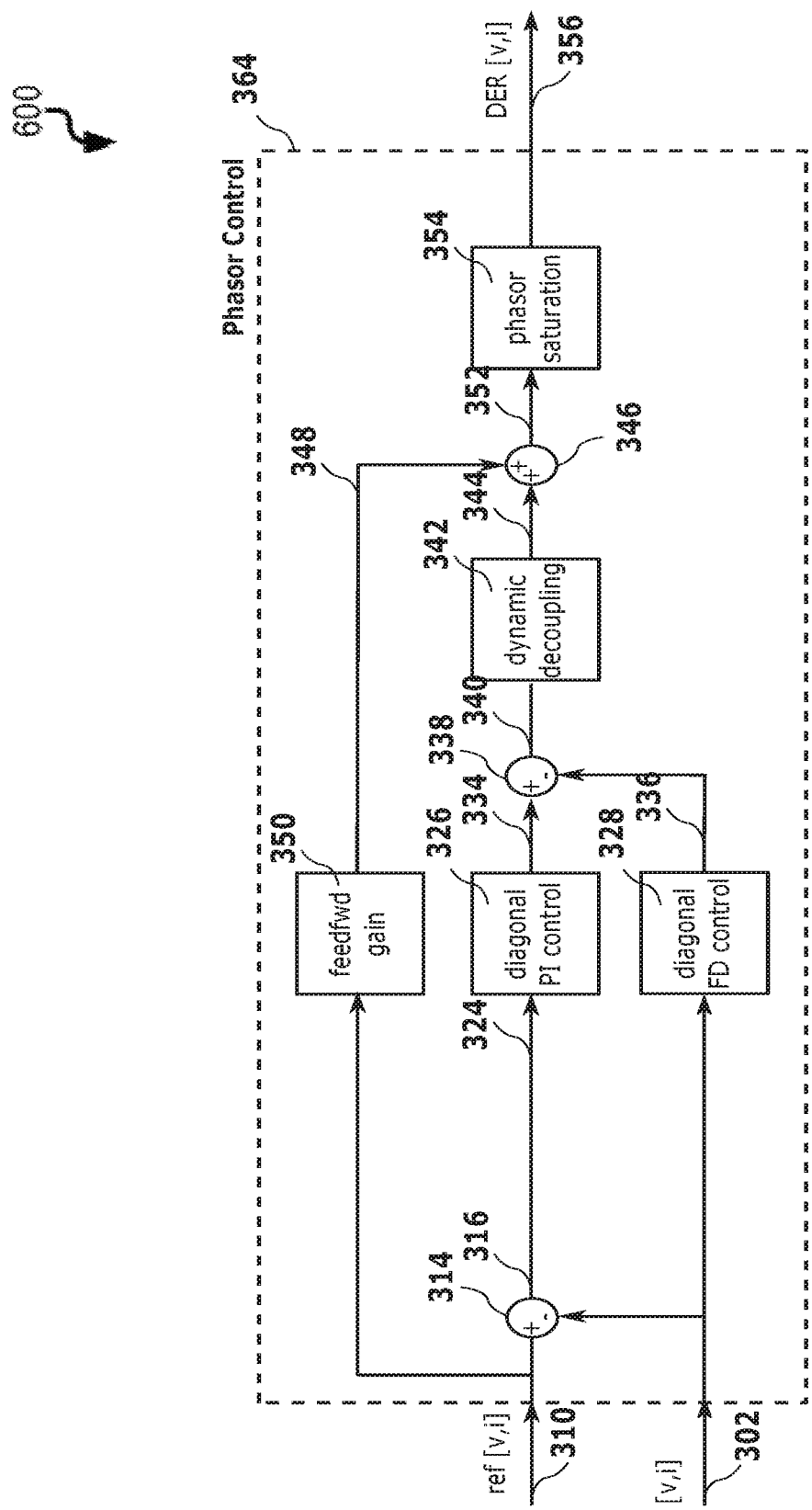
FIG. 6 is another system block diagram illustrating control algorithms of a phasor controller of one or more DERs.

FIG. 6 is another system block diagram 600 illustrating control algorithms of a phasor controller of one or more DERs. Alternatively, phasor control 364 can also be a two-input, two-output decoupling synchrophasor based control algorithm that computes a control data stream 356 from a reference data stream 310 and a power data stream 302. Power data stream 302 can include a feedback data stream of control data stream 356.

A difference between the reference data stream 310 and the power data stream 302 can be computed by the difference junction 314 to generate an error data stream 324. The error data stream 324 can be provided to diagonal PI controller 326. The diagonal PI controller 326 can compute the PI control output data stream 334 as the sum of a proportional gain $K_p$ amplified error data stream 324 and an integral gain $K_i$ amplified time integrated error data stream 324. Alternatively, other linear combinations of a gain amplified error data stream 324 and time integrated error data stream 324 can be implemented in discrete-time filters.

The power data stream 302 can be provided to the diagonal FD control 328. The diagonal FD controller 328 can compute the FD control output data stream 336 as a derivative gain $K_d$ amplified high pass filtered power data stream 302. Alternatively, the diagonal FD controller 328 can be a derivative gain $K_d$ amplified high pass filtered power data stream 302 implemented in discrete-time filters.

Further decoupling can be accomplished in the phasor control 364 by combining the PI control output data stream 334 and the FD control output signal 236 produced by the difference or summing junction 338 as a difference data stream 340 to a multi-input, multi-output decoupling filter 342. The decoupling filter 342 can include an output filter that can adjust the output signal according to the characteristics of the DER and can be a multivariable dynamic system that aims to decouple the real and reactive output signal [P, Q] either at the DER at Level 1 or at the POI at Level 2 control. Alternatively, the decoupling filter 342 can be a fixed matrix gain to statically decouple the feedback data stream either at the DER at Level 1 or at the POI at Level 2.

The decoupled output data stream 344 of the decoupling filter 342 can be combined by the summing junction 346 with the feed forward data stream 348 of the feed forward filter 350. The feed forward filter 350 can directly take the reference data stream 310 to generate the feed forward control data stream 348. The feed forward filter 350 in the phasor control 364 can allow the control signals to directly react to any changes in the reference data stream 310 without first having to go through the diagonal PI controller 326 and can allow for a faster phasor control in response to set point changes in the reference control data stream. The feed forward filter 350 is similar to the decoupling filter 342, a multivariable dynamic system that also aims to decouple the reference data stream either at the DER at Level 1 or at the POI at Level 2 control. Alternatively, the feed forward filter 350 can be a fixed matrix gain to maintain or promote statically decoupled the phasor feedback signal [v, i] either at the DER at Level 1 or at the POI at Level 2.

Summation data stream 352 obtained by summing junction 346 can be provided to a phasor saturation 354 for limiting the control data stream 356. The phasor saturation can have different embodiments and can limit the range or rate of change of the power angle, $\alpha$, the maximum current amplitude, I, and/or the maximum and minimum rectangular coordinates, or any variations of these data streams and/or corresponding rates of change.

Figure 7:
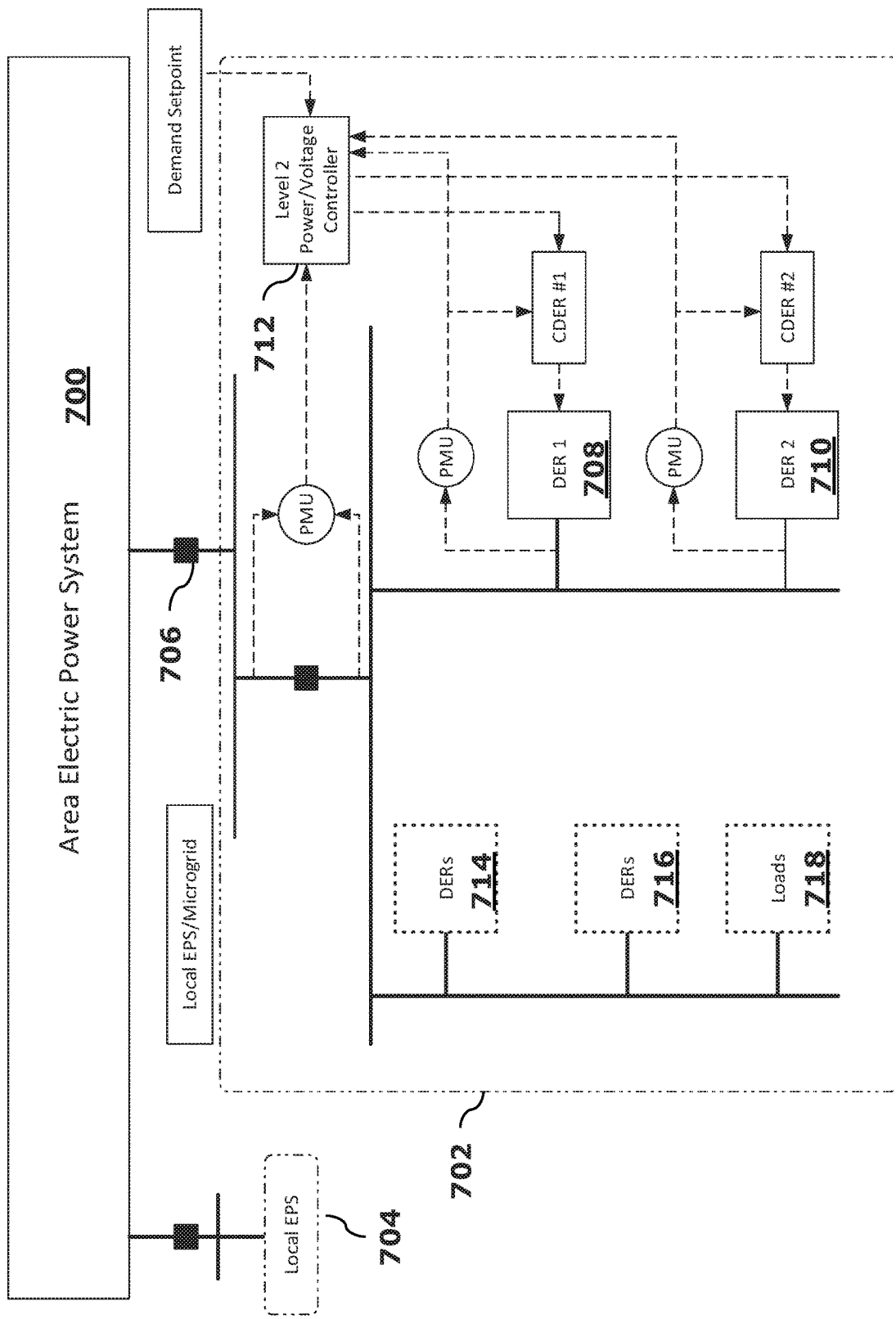
FIG. 7 is a system block diagram illustrating an area EPS connected to a local EPS having hierarchical control of DERs.

FIG. 7 is a system block diagram illustrating an area EPS connected to a local EPS having hierarchical control of DERs. Two local EPS systems 702 and 704 are shown connected to the area EPS 700. An electrical disconnect switch 706, or PCC, can be positioned between the area EPS 700 and the local EPS 702. When the electrical disconnect switch 706 is opened, the local EPS 702 maintains its own supply and demand balance of energy. The energy demand should match the energy supply. Two Level 1 CDER DER 1 708 and DER 2 710 can be controlled by a Level 2 Power/Voltage controller 712. The Level 2 Power/Voltage controller 712 can supervise the two CDERs 708 and 710 to maintain an energy balance while disconnected and provide control of the total demand of the grid while the local EPS 702 is connected to the area EPS 700.

The demand set point can be determined in a variety of ways. For example, if connected, the demand from the area EPS 700 can be determined such that the maximum value to the local EPS 702 is achieved. In another example, if disconnected, the supply and demand can be determined by the available energy in the CDERs 708 and 710 and the production of power from uncontrolled DERs 714, 716, or loads 718.

PMUs can be used for control of the CDERs 708 and 710 at high data rates (e.g., 60 Hz). The set points for the CDERs can be determined by the level 2 Power/Voltage controller 712. Note that the level 2 controller 712 can send both real and reactive power commands to the CDERS 708 and 710 as well as frequency and voltage set point commands. The real and reactive power commands ensure an energy balance in the local EPS and the frequency and voltage set points ensure that the voltage and voltage angle of the local EPS tracks the voltage and voltage angle of the area EPS. This allows the local EPS 702 to disconnect and reconnect to the area EPS 700 on command.

Figure 8:
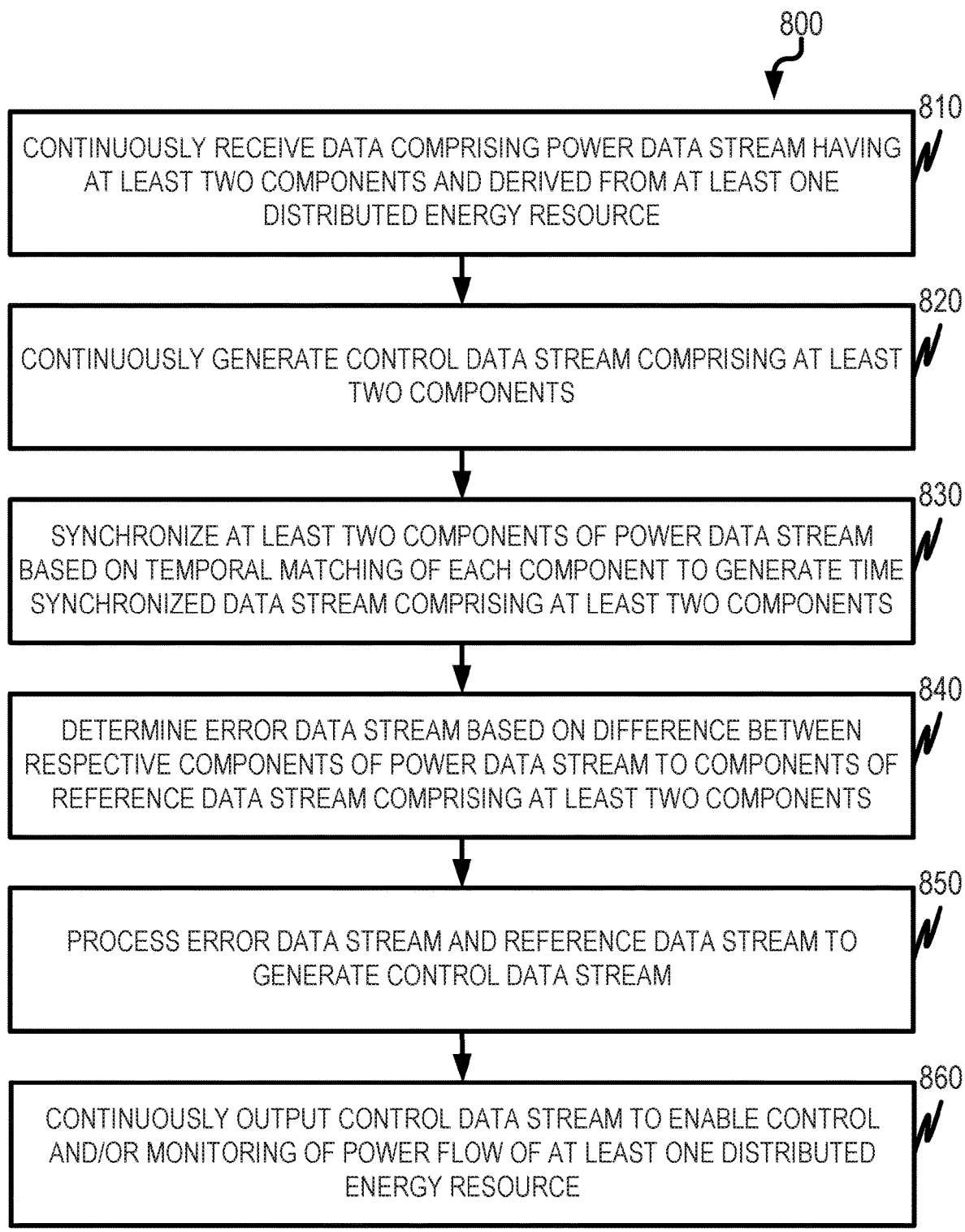
FIG. 8 is a process flow diagram illustrating characterizing attributes of a power system having one or more distributed energy resources.

FIG. 8 is a process flow diagram 800 illustrating characterizing attributes of a power system having one or more distributed energy resources. Data including a power data stream having at least two components can be continuously received, at 810. The power data stream can be derived from at least one distributed energy resource. A control data stream that includes at least two components can be continuously generated, at 820. Generating the control data stream can optionally include synchronizing, at 830, the at least two components of the power data stream based on temporal matching of each component to generate a time synchronized data stream including at least two components. An error data stream can be determined, at 840, based on the difference between respective components of the power data stream to the components of the reference data stream having at least two components. The error data stream can be processed, at 850, to generate the control data stream. The control data stream can be continuously output, at 860, to enable control and/or monitoring of power flow of at least one distributed energy resource.

Figure 9:
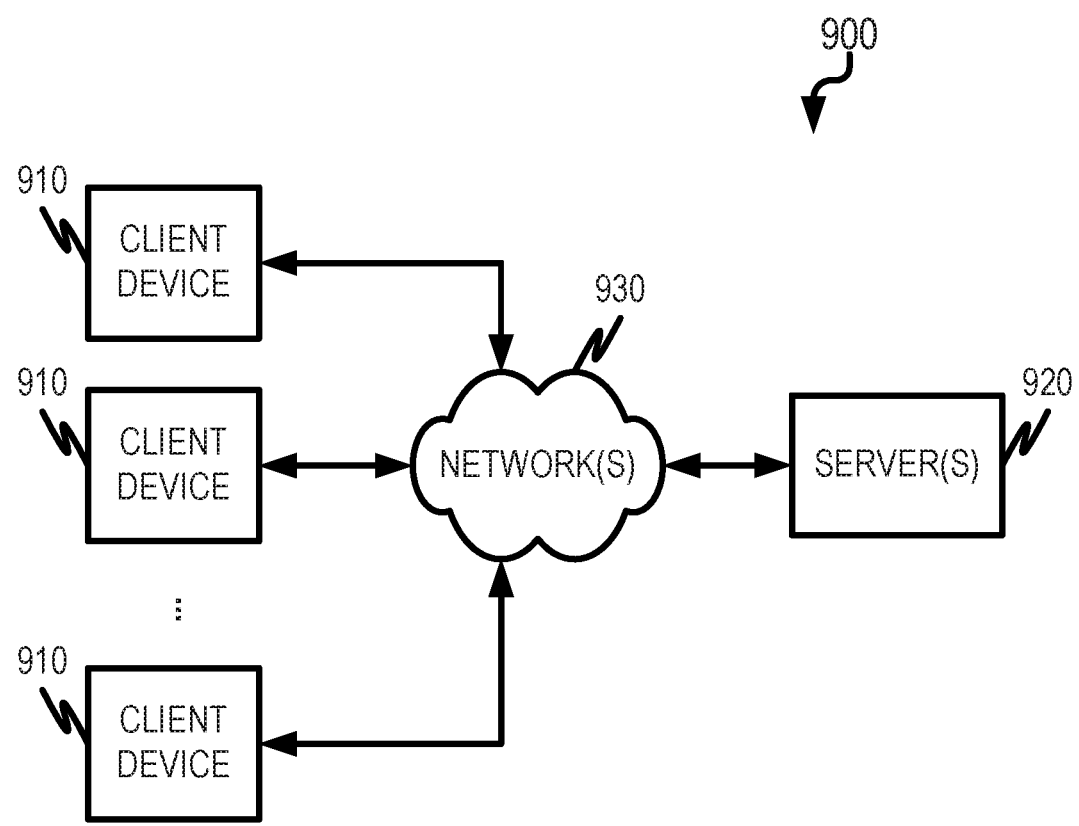
FIG. 9 is another system block diagram illustrating an architecture for use in connection with the current subject matter.

FIG. 9 is another system block diagram illustrating an architecture 900 for use in connection with the current subject matter. The current subject matter is described in connection with an arrangement involving one or more client devices 910 and one or more servers 920 which can communicate over one or more networks 930. Each of the one or more client devices 910 and the one or more servers 920 comprise one or more programmable data processors and memory for storing instructions for executed by such data processor(s). Furthermore, it will be appreciated that each of the client devices 910 or servers 920 can comprise more than one computing device depending on the desired configuration and that the illustrations in FIG. 9 is simplified to aid in the understanding of the current subject matter.

The functional blocks described herein can be implemented in commercial computing platforms such as advanced Programmable Logic Controllers (PLCs) or in industrial grade PCs such as the SEL 3355 that runs multiple tasks, one of which is the controller. The controller processing functionality can be written in any computer language, but one implementation is using C++ running on Windows or Linux operating systems. The output commands from then controller may use standard control protocols such as IEC 61850 Goose or Modbus over Ethernet. In order to maintain high security, fiber optic connections are generally used between the controller platform and the inverter device that is used to control the real and reactive power flow to the local EPS. For example, the PQ( ) and invPQ( ) functions are preferably implemented using the standard trigonometry and square root functions provided in the computer language used to implement the controller.

One or more aspects or features of the subject matter described herein can be realized in digital electronic circuitry, integrated circuitry, specially designed application specific integrated circuits (ASICs), field programmable gate arrays (FPGAs) computer hardware, firmware, software, and/or combinations thereof. These various aspects or features can include implementation in one or more computer programs that are executable and/or interpretable on a programmable system including at least one programmable processor, which can be special or general purpose, coupled to receive data and instructions from, and to transmit data and instructions to, a storage system, at least one input device, and at least one output device. The programmable system or computing system can include clients and servers. A client and server are generally remote from each other and typically interact through a communication network. The relationship of client and server arises by virtue of computer programs running on the respective computers and having a client-server relationship to each other.

These computer programs, which can also be referred to as programs, software, software applications, applications, components, or code, include machine instructions for a programmable processor, and can be implemented in a high-level procedural language, an object-oriented programming language, a functional programming language, a logical programming language, and/or in assembly/machine language. As used herein, the term "computer-readable medium" refers to any computer program product, apparatus and/or device, such as for example magnetic discs, optical disks, memory, and Programmable Logic Devices (PLDs), used to provide machine instructions and/or data to a programmable processor, including a computer-readable medium that receives machine instructions as a computer-readable signal. The term "computer-readable signal" refers to any signal used to provide machine instructions and/or data to a programmable processor. The computer-readable medium can store such machine instructions non-transitorily, such as for example as would a non-transient solid-state memory or a magnetic hard drive or any equivalent storage medium. The computer-readable medium can alternatively or additionally store such machine instructions in a transient manner, for example as would a processor cache or other random access memory associated with one or more physical processor cores.

Figure 10:
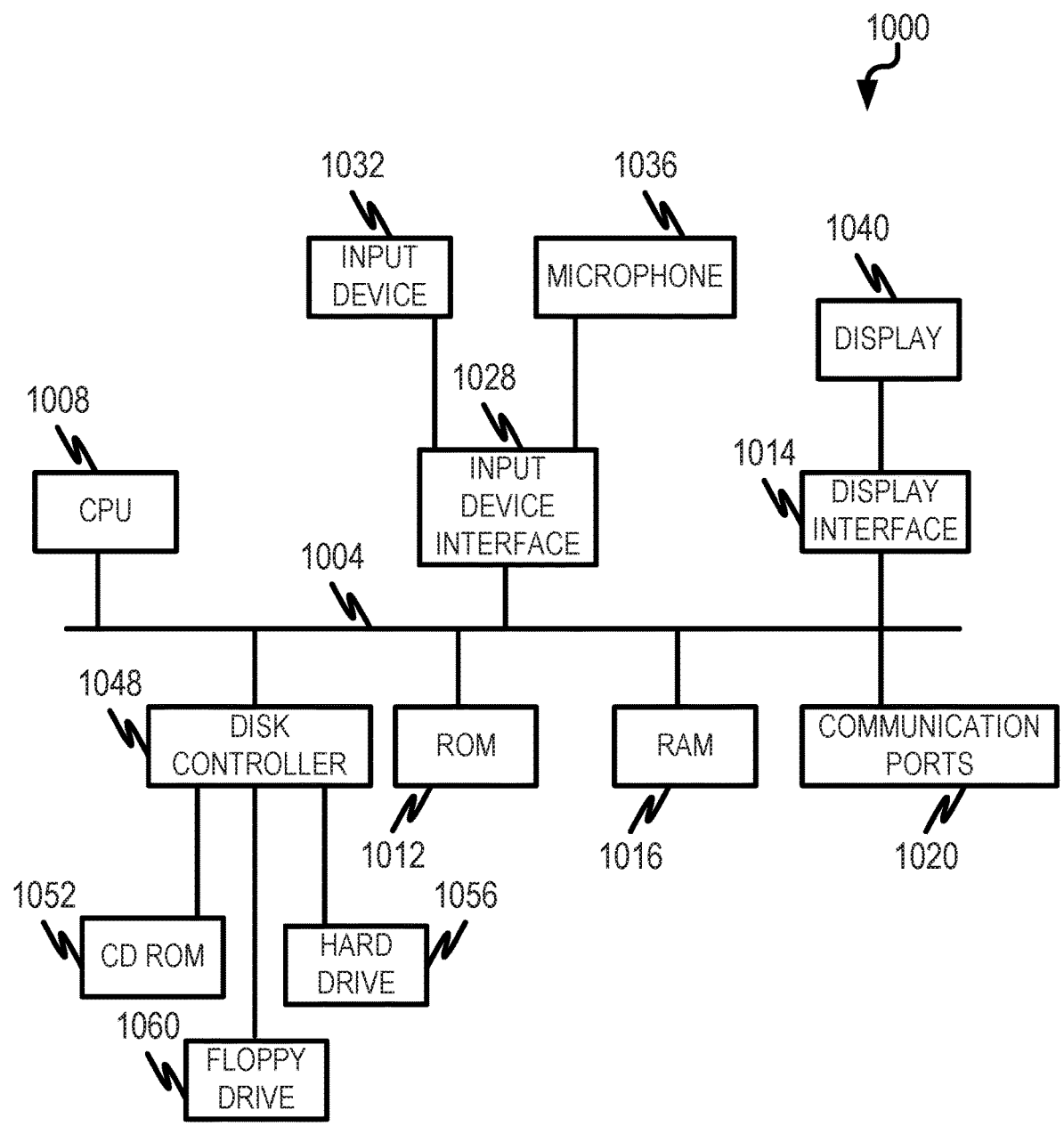
FIG. 10 is a diagram illustrating a sample computing device architecture for implementing various aspects described herein.

FIG. 10 is a diagram illustrating a sample computing device architecture for implementing various aspects described herein. A system bus 1004 can serve as the information highway interconnecting the other illustrated components of the hardware. A processing system 1008 labeled CPU (central processing unit) (e.g., one or more computer processors/data processors at a given computer or at multiple computers), can perform calculations and logic operations required to execute a program. A non-transitory processor-readable storage medium, such as read only memory (ROM) 1012 and random access memory (RAM) 1016, can be in communication with the processing system 1008 and can include one or more programming instructions for the operations specified here. Optionally, program instructions can be stored on a non-transitory computer-readable storage medium such as a magnetic disk, optical disk, recordable memory device, flash memory, or other physical storage medium.

In one example, a disk controller 1048 can interface one or more optional disk drives to the system bus 1004. These disk drives can be external or internal floppy disk drives such as 1060, external or internal CD-ROM, CD-R, CD-RW or DVD, or solid state drives such as 1052, or external or internal hard drives 1056. As indicated previously, these various disk drives 1052, 1056, 1060 and disk controllers are optional devices. The system bus 1004 can also include at least one communication port 1020 to allow for communication with external devices either physically connected to the computing system or available externally through a wired or wireless network. In some cases, the communication port 1020 includes or otherwise comprises a network interface.

To provide for interaction with a user, the subject matter described herein can be implemented on a computing device having a display 1040 (e.g., a CRT (cathode ray tube) or LCD (liquid crystal display) monitor) for displaying information obtained from the system bus 1004 to the user and an input device 1032 such as keyboard and/or a pointing device (e.g., a mouse or a trackball) and/or a touchscreen by which the user can provide input to the computer. Other kinds of input devices 1032 can be used to provide for interaction with a user as well; for example, feedback provided to the user can be any form of sensory feedback (e.g., visual feedback, auditory feedback by way of a microphone 1036, or tactile feedback); and input from the user can be received in any form, including acoustic, speech, or tactile input. In the input device 1032 and the microphone 1036 can be coupled to and convey information via the system bus 1004 by way of an input device interface 1028. Other computing devices, such as dedicated servers, can omit one or more of the display 1040 and display interface 1014, the input device 1032, the microphone 1036, and input device interface 1028.

To provide for interaction with a user, the subject matter described herein can be implemented on a computer having a display device (e.g., a CRT (cathode ray tube) or LCD (liquid crystal display) monitor) for displaying information to the user and a keyboard and a pointing device (e.g., a mouse or a trackball) and/or a touchscreen by which the user can provide input to the computer. Other kinds of devices can be used to provide for interaction with a user as well; for example, feedback provided to the user can be any form of sensory feedback (e.g., visual feedback, auditory feedback, or tactile feedback); and input from the user can be received in any form, including acoustic, speech, or tactile input.

In the descriptions above and in the claims, phrases such as "at least one of" or "one or more of" may occur followed by a conjunctive list of elements or features. The term "and/or" may also occur in a list of two or more elements or features. Unless otherwise implicitly or explicitly contradicted by the context in which it is used, such a phrase is intended to mean any of the listed elements or features individually or any of the recited elements or features in combination with any of the other recited elements or features. For example, the phrases "at least one of A and B;" "one or more of A and B;" and "A and/or B" are each intended to mean "A alone, B alone, or A and B together." A similar interpretation is also intended for lists including three or more items. For example, the phrases "at least one of A, B, and C;" "one or more of A, B, and C;" and "A, B, and/or C" are each intended to mean "A alone, B alone, C alone, A and B together, A and C together, B and C together, or A and B and C together." In addition, use of the term "based on," above and in the claims is intended to mean, "based at least in part on," such that an unrecited feature or element is also permissible.

The subject matter described herein can be embodied in systems, apparatus, methods, and/or articles depending on the desired configuration. The implementations set forth in the foregoing description do not represent all implementations consistent with the subject matter described herein. Instead, they are merely some examples consistent with aspects related to the described subject matter. Although a few variations have been described in detail above, other modifications or additions are possible. In particular, further features and/or variations can be provided in addition to those set forth herein. For example, the implementations described above can be directed to various combinations and subcombinations of the disclosed features and/or combinations and subcombinations of several further features disclosed above. In addition, the logic flows depicted in the accompanying figures and/or described herein do not necessarily require the particular order shown, or sequential order, to achieve desirable results. Other implementations may be within the scope of the following claims.

One or more aspects or features of the subject matter described herein can be realized in digital electronic circuitry, integrated circuitry, specially designed application specific integrated circuits (ASICs), field programmable gate arrays (FPGAs) computer hardware, firmware, software, and/or combinations thereof. These various aspects or features can include implementation in one or more computer programs that are executable and/or interpretable on a programmable system including at least one programmable processor, which can be special or general purpose, coupled to receive data and instructions from, and to transmit data and instructions to, a storage system, at least one input device, and at least one output device. The programmable system or computing system can include clients and servers. A client and server are generally remote from each other and typically interact through a communication network. The relationship of client and server arises by virtue of computer programs running on the respective computers and having a client-server relationship to each other.

These computer programs, which can also be referred to as programs, software, software applications, applications, components, or code, include machine instructions for a programmable processor, and can be implemented in a high-level procedural language, an object-oriented programming language, a functional programming language, a logical programming language, and/or in assembly/machine language. As used herein, the term "computer-readable medium" refers to any computer program product, apparatus and/or device, such as for example magnetic discs, optical disks, memory, and Programmable Logic Devices (PLDs), used to provide machine instructions and/or data to a programmable processor, including a computer-readable medium that receives machine instructions as a computer-readable signal. The term "computer-readable signal" refers to any signal used to provide machine instructions and/or data to a programmable processor. The computer-readable medium can store such machine instructions non-transitorily, such as for example as would a non-transient solid-state memory or a magnetic hard drive or any equivalent storage medium. The computer-readable medium can alternatively or additionally store such machine instructions in a transient manner, for example as would a processor cache or other random access memory associated with one or more physical processor cores.

In the descriptions above and in the claims, phrases such as "at least one of" or "one or more of" may occur followed by a conjunctive list of elements or features. The term "and/or" may also occur in a list of two or more elements or features. Unless otherwise implicitly or explicitly contradicted by the context in which it is used, such a phrase is intended to mean any of the listed elements or features individually or any of the recited elements or features in combination with any of the other recited elements or features. For example, the phrases "at least one of A and B;" "one or more of A and B;" and "A and/or B" are each intended to mean "A alone, B alone, or A and B together." A similar interpretation is also intended for lists including three or more items. For example, the phrases "at least one of A, B, and C;" "one or more of A, B, and C;" and "A, B, and/or C" are each intended to mean "A alone, B alone, C alone, A and B together, A and C together, B and C together, or A and B and C together." In addition, use of the term "based on," above and in the claims is intended to mean, "based at least in part on," such that an unrecited feature or element is also permissible.

The subject matter described herein can be embodied in systems, apparatus, methods, and/or articles depending on the desired configuration. The implementations set forth in the foregoing description do not represent all implementations consistent with the subject matter described herein. Instead, they are merely some examples consistent with aspects related to the described subject matter. Although a few variations have been described in detail above, other modifications or additions are possible. In particular, further features and/or variations can be provided in addition to those set forth herein. For example, the implementations described above can be directed to various combinations and subcombinations of the disclosed features and/or combinations and subcombinations of several further features disclosed above. In addition, the logic flows depicted in the accompanying figures and/or described herein do not necessarily require the particular order shown, or sequential order, to achieve desirable results. Other implementations may be within the scope of the following claims.

What is claimed is:

1. A method for controlling a power system, the method being implemented by at least one data processor, the method comprising:
    continuously receiving, by the at least one data processor, data comprising a power data stream based on a measurement at a point of interest of the power system, the power data stream having at least two components, wherein at least one distributed energy resource is electrically coupled to the point of interest providing the power data stream;
    continuously generating, by the at least one data processor, a control data stream based on the power data stream, an error data stream, and a reference data stream, the control data stream comprising a real power component and a reactive power component and continuously generated by:
        determining, by the at least one data processor, the error data stream comprising a voltage component and a current component based on a difference between respective components of the power data stream to components of the reference data stream comprising at least two components; and
        independently processing, by the at least one data processor, each of the voltage component and the current component of the error data stream and the reference data stream to generate the control data stream, wherein the independent processing of each of the voltage component and the current component of the error data stream maintains decoupling between each component;
    continuously providing, by the at least one data processor, the control data stream to track the power data stream at the point of interest in the power system via a feedback loop to enable control and/or monitoring of power flow of the at least one distributed energy resource; and
    controlling, by the at least one data processor, power output of the at least one distributed energy resource based on the control data stream.

2. The method according to claim 1, further comprising synchronizing, by the at least one data processor, the at least two components of the power data stream based on temporal matching of each component to generate a time synchronized data stream comprising at least two components, wherein the error data stream is determined based on a difference between the time synchronized data stream and the reference data stream.

3. The method according to claim 1, wherein a feedback data stream comprises the control data stream and is combined with the power data stream and the reference data stream to generate the error data stream.

4. The method according to claim 3, wherein the processing of each of the voltage component and the current component of the error data stream and the reference data stream comprises:
providing, by the at least one data processor, the reference data stream to a first filter to obtain a filtered reference data stream, the error data stream to a second filter to obtain a filtered error data stream, and the feedback data stream to a third filter to obtain a filtered feedback data stream;
providing, by the at least one data processor, a difference between the filtered error data stream and the filtered feedback data stream to a fourth filter;
additively combining, by the at least one data processor, the difference between the filtered error data stream and the filtered feedback data stream with the filtered reference data stream to generate a summed data stream;
providing, by the at least one data processor, the summed data stream to a fifth filter to generate the control data stream.

5. The method according to claim 4, wherein at least one of the first, second, third, fourth, and fifth filters comprise at least one of a discrete time filter, a fixed matrix gain filter, a feed forward filter, a high pass filter, or a saturation filter.

6. The method according to claim 1, wherein the at least two components of the power data stream comprise a real power component and a reactive power component, wherein the real power component of the power data stream comprises a first combination of a voltage, a current, and a power angle, and wherein the reactive power component of the power data stream comprises a second combination of the voltage, the current, and the power angle.

7. The method according to claim 1, wherein the power data stream is continuously received from at least one phasor measurement unit (PMU).

8. The method according to claim 7, wherein the power data stream comprises a voltage phasor component and a current phasor component output from the at least one PMU, wherein the voltage phasor component and the current phasor component are time synchronized.

9. The method according to claim 1, wherein the power data stream is continuously received from an instrument capable of sampling and/or supplying at least one phasor measurement.

10. The method according to claim 1, wherein the reference data stream comprises a predetermined voltage component and a predetermined current component.

11. The method according to claim 1, wherein the at least one distributed energy resource comprise at least one of a photovoltaic cell, a battery, a fuel cell, a wind turbine, a combined cycle gas turbine, a sterling engine, an energy storage system, or a generator.

12. The method according to claim 1, further comprising:
continuously receiving, by the at least one data processor, point of interest data comprising data derived from at least two distributed energy resources having a combined power data stream;
determining, by the at least one data processor, the power data stream associated with each distributed energy resource from the combined power data stream; and
determining, by the at least one data processor, a combined control data stream comprising control data stream associated with each distributed energy resource.

13. The method according to claim 1, wherein the enabling control and/or monitoring of the power flow comprises real power flow or reactive power flow.

14. A system for controlling a power system comprising:
at least one data processor;
memory storing instructions which when executed by the at least one data processor result in operations comprising:
continuously receiving, by the at least one data processor, data comprising a power data stream based on a measurement at a point of interest of the power system, the power data stream having at least two components, wherein at least one distributed energy resource is electrically coupled to the point of interest providing the power data stream;
continuously generating, by the at least one data processor, a control data stream based on the power data stream, an error data stream, and a reference data stream, the control data stream comprising a real power component and a reactive power component and continuously generated by:
determining, by the at least one data processor, the error data stream comprising a voltage component and a current component based on a difference between respective components of the power data stream to components of the reference data stream comprising at least two components; and
independently processing, by the at least one data processor, each of the voltage component and the current component of the error data stream and the reference data stream to generate the control data stream, wherein the independent processing of each of the voltage component and the current component of the error data stream maintains decoupling between each component;
continuously providing, by the at least one data processor, the control data stream to track the point of interest in the power system via a feedback loop to enable control and/or monitoring of power flow of the at least one distributed energy resource; and
controlling, by the at least one data processor, power output of the at least one distributed energy resource based on the control data stream.

15. The system according to claim 14, wherein the operations further comprise synchronizing, by the at least one data processor, the at least two components of the power data stream based on temporal matching of each component to generate a time synchronized data stream comprising at least two components, wherein the error data stream is determined based on a difference between the time synchronized data stream and the reference data stream.

16. The system according to claim 14, wherein a feedback data stream comprises the control data stream and is combined with the power data stream and the reference data stream to generate the error data stream.

17. The system according to claim 16, wherein the processing of each of the voltage component and the current component of the error data stream and the reference data stream comprises:

providing, by the at least one data processor, the reference data stream to a first filter to obtain a filtered reference data stream, the error data stream to a second filter to obtain a filtered error data stream, and the feedback data stream to a third filter to obtain a filtered feedback data stream;

providing, by the at least one data processor, a difference between the filtered error data stream and the filtered feedback data stream to a fourth filter;

additively combining, by the at least on data processor, the difference between the filtered error data stream and the filtered feedback data stream with the filtered reference data stream to generate a summed data stream;

providing, by the at least one data processor, the summed data stream to a fifth filter to generate the control data stream.

18. The system according to claim 17, wherein at least one of the first, second, third, fourth, and fifth filters comprise at least one of a discrete time filter, a fixed matrix gain filter, a feed forward filter, a high pass filter, or a saturation filter.

19. The system according to claim 14, wherein the at least two components of the power data stream comprise a real power component and a reactive power component, wherein the real power component of the power data stream comprises a first combination of a voltage, a current, and a power angle, and wherein the reactive power component of the power data stream comprises a second combination of the voltage, the current, and the power angle.

20. The system according to claim 14, wherein the power data stream is continuously received from at least one phasor measurement unit (PMU).

21. The system according to claim 20, wherein the power data stream comprises a voltage phasor component and a current phasor component output from the at least one PMU, wherein the voltage phasor component and the current phasor component are time synchronized.

22. The system according to claim 14, wherein the power data stream is continuously received from an instrument capable of sampling and/or supplying at least one phasor measurement.

23. The system according to claim 14, wherein the reference data stream comprises a predetermined voltage component and a predetermined current component.

24. The system according to claim 14, wherein the at least one distributed energy resource comprise at least one of a photovoltaic cell, a battery, a fuel cell, a wind turbine, a combined cycle gas turbine, a sterling engine, an energy storage system, or a generator.

25. The system according to claim 14, wherein the operations further comprise:
continuously receiving, by the at least one data processor, point of interest data comprising data derived from at least two distributed energy resources having a combined power data stream;
determining, by the at least one data processor, the power data stream associated with each distributed energy resource from the combined power data stream; and
determining, by the at least one data processor, a combined control data stream comprising control data stream associated with each distributed energy resource.

26. A non-transitory computer program product, for controlling a power system, comprising a computer-readable storage medium having computer-readable program instructions, which when executed result in operations comprising:
continuously receiving, by at least one data processor, data comprising a power data stream based on a measurement at a point of interest of the power system, the power data stream having at least two components, wherein at least one distributed energy resource is electrically coupled to the point of interest providing the power data stream;
continuously generating, by the at least one data processor, a control data stream based on the power data stream, an error data stream, and a reference data stream, the control data stream comprising a real power component and a reactive power component and continuously generated by:
synchronizing, by the at least one data processor, the at least two components of the power data stream based on temporal matching of each component to generate a time synchronized data stream comprising at least two components;
determining, by the at least one data processor, the error data stream comprising a voltage component and a current component based on a difference between respective components of the power data stream to components of the reference data stream comprising at least two components; and
independently processing, by the at least one data processor, each of the voltage component and the current component of the error data stream and the reference data stream to generate the control data stream, wherein the independent processing of each of the voltage component and the current component of the error data stream maintains decoupling between each component;
continuously providing, by the at least one data processor, the control data stream to track the point of interest in the power system via a feedback loop to enable control and/or monitoring of power flow of the at least one distributed energy resource; and
controlling, by the at least one data processor, power output of the at least one distributed energy resource based on the control data stream.

27. A method for controlling a power system, the method being implemented by at least one data processor and comprising:
continuously receiving, by the at least one data processor, data comprising a power data stream based on a measurement at a point of interest of the power system, the power data stream having at least two components, wherein at least one distributed energy resource is electrically coupled to the point of interest providing the power data stream;
continuously generating, by the at least one data processor, a control data stream based on the power data stream, an error data stream, and a reference data stream, the control data stream comprising a real power component and a reactive power component and continuously generated by:
synchronizing, by the at least one data processor, the at least two components of the power data stream based on temporal matching of each component to generate a time synchronized data stream comprising at least two components;
determining, by the at least one data processor, the error data stream comprising a voltage component and a current component based on a difference between respective components of the time synchronized data stream to components of the reference data stream comprising at least two components; and independently processing, by the at least one data processor, each of the voltage component and the current component of the error data stream and the reference data stream to generate the control data stream, wherein the independent processing of each of the voltage component and the current component of the error data stream maintains decoupling between each component;

continuously providing, by the at least one data processor, the control data stream to track the point of interest in the power system via a feedback loop to enable control and/or monitoring of power flow of the at least one distributed energy resource; and controlling, by the at least one data processor, power output of the at least one distributed energy resource based on the control data stream.

\* \* \* \* \*